(12) United States Patent
Kim

(10) Patent No.: US 12,509,758 B2
(45) Date of Patent: Dec. 30, 2025

(54) HYBRID STICK MASK AND MANUFACTURING METHOD THEREFOR, MASK ASSEMBLY INCLUDING HYBRID STICK MASK, AND ORGANIC LIGHT EMITTING DISPLAY DEVICE USING SAME

(71) Applicant: Keeps Biopharma Inc., Hwaseong-si (KR)

(72) Inventor: Jungho Kim, Hwaseong-si (KR)

(73) Assignee: KEEPS BIOPHARMA INC., Hwaseong-si (KR)

( * ) Notice: Subject to any disclaimer, the term of this patent is extended or adjusted under 35 U.S.C. 154(b) by 662 days.

(21) Appl. No.: 17/601,352

(22) PCT Filed: Apr. 21, 2020

(86) PCT No.: PCT/KR2020/005236
§ 371 (c)(1),
(2) Date: Oct. 4, 2021

(87) PCT Pub. No.: WO2020/242055
PCT Pub. Date: Dec. 3, 2020

(65) Prior Publication Data
US 2022/0181595 A1    Jun. 9, 2022

(30) Foreign Application Priority Data
May 24, 2019  (KR) .......................... 10-2019-0061079

(51) Int. Cl.
*C23C 14/04*      (2006.01)
*H10K 59/12*     (2023.01)
*H10K 71/16*     (2023.01)

(52) U.S. Cl.
CPC ............ *C23C 14/042* (2013.01); *H10K 59/12* (2023.02); *H10K 71/166* (2023.02)

(58) Field of Classification Search
USPC .......................................... 118/721, 504, 505
See application file for complete search history.

(56) References Cited

U.S. PATENT DOCUMENTS

| 8,273,179 B2 | 9/2012 | Kim et al. |
| 2011/0185966 A1 | 8/2011 | Lee et al. |

(Continued)

FOREIGN PATENT DOCUMENTS

| KR | 10-0534580 | 12/2005 |
| KR | 10-2010-0010251 | 2/2010 |

(Continued)

OTHER PUBLICATIONS

English Translation KR-20100010251A (Year: 2010).*

(Continued)

*Primary Examiner* — Yewebdar T Tadesse
(74) *Attorney, Agent, or Firm* — KILE PARK REED & HOUTTEMAN PLLC

(57) ABSTRACT

Disclosed are a hybrid stick mask and a manufacturing method therefor, a mask assembly including a hybrid stick mask, and an organic light emitting display device using same. A hybrid stick mask, according to one embodiment of the present invention, comprises: a structural stick mask having a plurality of openings in a first direction, having first bonding regions provided along the circumference of the openings, and having tension fixing portions at both ends in the first direction so as to be fixed to a frame while tensile force is applied; and cell unit masks each having a deposition region corresponding to the opening, and a second bonding region provided along the circumference of the deposition region so as to be bonded to the first bonding region. Each of the cell unit masks can be individually coupled to the structural stick mask.

13 Claims, 34 Drawing Sheets

(56) References Cited

U.S. PATENT DOCUMENTS

| | | | |
|---|---|---|---|
| 2015/0027367 A1 | 1/2015 | Hong | |
| 2016/0164044 A1* | 6/2016 | Oh | H10K 71/00 438/28 |
| 2017/0263867 A1* | 9/2017 | Kim | C23C 14/042 |
| 2018/0083192 A1* | 3/2018 | Jeong | H10K 71/00 |
| 2019/0368025 A1* | 12/2019 | Kim | C23C 14/042 |

FOREIGN PATENT DOCUMENTS

| | | | |
|---|---|---|---|
| KR | 20170134827 A | * | 12/2017 |
| KR | 10-2018-0087824 | | 8/2018 |
| KR | 101909582 B1 | * | 10/2018 |
| KR | 10-2019-0025433 | | 3/2019 |
| KR | 20190090177 A | * | 8/2019 |

OTHER PUBLICATIONS

English Translation KR-20180087824A (Year: 2018).*
English Translation KR-2019000177A (Year: 2019).*
English Translation KR-20170134827-A (Year: 2017).*
International Search Report with English translation for International Application No. PCT/KR2020/005236, dated Aug. 7, 2020.

\* cited by examiner

HYBRID STICK MASK AND MANUFACTURING METHOD THEREFOR, MASK ASSEMBLY INCLUDING HYBRID STICK MASK, AND ORGANIC LIGHT EMITTING DISPLAY DEVICE USING SAME

CROSS-REFERENCE TO RELATED APPLICATION(S)

This application is a national entry of International Application No. PCT/KR2020/005236, filed on Apr. 21, 2020, which claims under 35 U.S.C. § 119(a) and 365(b) priority to and benefits of Korean Patent Application No. 10-2019-0061079 filed on May 24, 2019 in the Korean Intellectual Property Office, the entire contents of which are incorporated herein by reference.

TECHNICAL FIELD

The present invention relates to a hybrid stick mask, a method of manufacturing the same, a mask assembly including the hybrid stick mask, and an organic light emitting diode (OLED) display using the same, and more particularly, to a hybrid stick mask configured to deposit a deposition material on thin film transistor (TFT) glass, a method of manufacturing the same, a mask assembly including the hybrid stick mask, and an OLED display using the same.

BACKGROUND ART

Among displays, an organic light emitting diode (OLED) display has advantages such as a wide viewing angle, excellent contrast, and a high response speed. Accordingly, areas in which OLED displays are used are gradually increasing.

An intermediate layer including an emission layer and electrodes of the OLED display may be formed using a variety of methods, one of which is deposition.

In small and medium-sized OLED displays, a most significant difficulty in manufacturing a high resolution OLED display is in an organic deposition process which is the core of forming RGB pixels in an OLED display manufacturing process. Fine metal masks (hereinafter referred to as masks) having the same pattern as patterns of thin film and the like which will be formed on thin film transistor (TFT) glass are position-aligned and a raw material of thin film is deposited to form a thin film having a desired pattern. The deposition process employs a method of heating an organic material in a deposition source located at a lower portion of a chamber and vaporizing the heated organic material to allow the organic material to pass through a mask and be deposited on TFT glass.

In order to form a desired deposition pattern on the TFT glass, it is important to press the mask against the TFT glass without a gap therebetween. To this end, it is necessary to embody and fix a position between a plurality of holes, through which the deposition material on the mask passes, with strict precision. Since a current thickness of the mask is 5 μm to 30 μm, which is very thin, when the mask is fixed without being tensioned, a sag occurs in a gravitational direction and it is very difficult to precisely embody a position of the hole. Eventually, in the deposition process, the mask is spaced apart from the TFT glass forms and a defect in mixing colors occurs as a result.

Accordingly, to maintain flatness with the TFT glass, it is necessary to apply tension to and tightly pull the mask to maintain an elastic force. In order to maintain the mask tightly, additional wings for tension are formed on edges of the mask and wing portions are held and tensioned with a clamp configured to apply tension thereto. Holes of the mask are position-aligned to coincide with the pattern of the thin film or the like which will be formed on the TFT glass and then parts of the edges of the mask which are overlapped with a frame are welded to manufacture a mask assembly.

In the case of an active matrix OLED (AMOLED) panel, as mass production, sixth generation half size has been developed, but large-area displays such as seventh generation, eighth generation, and the like also need to be manufactured. This is because large-sized AMOLED panels may be manufactured at the same time by multiple-chamfered manufacturing only when the large-area displays are provided.

Recently, large-area high resolution displays have been needed in a variety of electronic devices. In order to form ultra high definition (UHD), a finer-sized hole and a dense interval between holes are necessary. Although it is necessary to form a mask having a small thickness to decrease a pixel size and prevent a shadow for forming a high resolution pattern, there is a difficulty in embodying a mask having a certain thickness or less with a currently commercialized technique.

When a mask is manufactured to be thin for precise hole processing of high resolution, a wave is formed in the mask and a sag in a gravitational direction occurs, and thus it is difficult to cause a deposition position of TFT glass and a hole position of the mask to coincide with each other. Also, there is a problem that the mask is not pressed against the TFT glass in a deposition process. In order to compensate for this, it is necessary to fix the mask to the frame through welding or the like while the mask is tightly tensioned.

In a conventional mask having a size of a mother glass of TFT glass, currently, several sheets of stick masks are tensioned and fixed to a frame to be used as a full mask assembly. The stick masks are commercialized to a level of 500 ppi to 600 ppi but it is difficult to embody more than that due to technical limitations.

When a stick mask having a thickness of 10 μm and a length of about 1,100 mm is tensioned in a longitudinal direction to embody a sixth generation half size, there are problems in that it is difficult to adjust position precision and the mask is split due to tension or not welded while being weld-fixed. Also, there are technical limitations, such as the difficulty of manufacturing a thin mask by rolling using Invar which is a material of a stick mask, and decreased thickness precision.

Up to now, stick masks have been manufactured through wet etching, and electroplating, laser machining, and the like have been tried for manufacturing a thin film for high resolution precise hole processing. However, with conventional stick masks, the sizes of such stick masks and tensioning and welding of a thin film remain as difficult problems to solve.

Since deposition efficiency is decreased by a residual deposition material when deposition is repetitively performed, replacement of stick masks due to cleaning and damaged welding portions with several times of use corresponds to an essential process in manufacturing an OLED display. There is a problem that it is necessary to replace whole stick masks when an existing stick mask is renovated. Also, in this replacement, precise position alignment is necessary but this is not easy.

Korean Patent Registration No. 10-0534580 discloses a technique related to a deposition mask in which one or more pattern masks are separately fixed to a frame mask including one or more opening portions corresponding to the opening portions and does not disclose a structural stick mask including a plurality of opening portions in a first direction, a first bonding area provided along a periphery of the opening portions, and tension-fixing portions provided on both ends in the first direction to be fixed to a frame while tension is applied. There is a problem that, when each unit mask is replaced, other adjacent unit masks are influenced and thus the number of masks to be renovated increases.

DISCLOSURE

Technical Problem

The present invention is directed to providing a hybrid stick mask in which an existing stick mask is dualized but integrally manufactured.

The present invention is also directed to providing a hybrid stick mask which overcomes a manufacturing limitation of an existing mask and a technical limitation in manufacturing a large-area mask and improves precision and mechanical strength of a mask.

The present invention is also directed to providing a hybrid stick mask configured to embody a precise high resolution deposition pattern even with a large-area mask.

Technical Solution

One aspect of the present invention provides a hybrid stick mask.

A hybrid stick mask according to one embodiment of the present invention includes a structural stick mask including a plurality of opening portions formed in a first direction, a first bonding area provided along a periphery of the opening portion, and tension-fixing portions provided on both ends in the first direction to be fixed to a frame while tension is applied and a cell-unit mask including a deposition area corresponding to the opening portion and a second bonding area provided on a periphery of the deposition area and bonded to the first bonding area. Here, such cell-unit masks may be separately coupled to the structural stick mask.

The structural stick mask may further include a reinforcing band provided on a rear surface of a bonding surface with the cell-unit mask to correct position distortion of the deposition area on the basis of a thin film transistor (TFT) position of TFT glass.

A plurality of such reinforcing bands may be arranged in parallel and spaced apart from each other in the first direction.

The reinforcing band may include a vertical reinforcing wall surrounding a welding point between the cell-unit mask and the structural stick mask.

The structural stick mask may include a welding protrusion protrusively formed on a rear surface of a bonding surface with the cell-unit mask.

The cell-unit mask may include a welding groove formed to be stepped, with a certain depth, from a contact surface with TFT glass.

A welding protrusion may protrude from a basal surface of the welding groove, and a top end of the welding protrusion may be formed to be lower than the contact surface.

The cell-unit mask may have a thermal expansion coefficient different from that of the structural stick mask.

The cell-unit mask may have a thickness different from that of the structural stick mask.

The deposition area may include a position alignment hole which allows a deposition material to pass therethrough, and the position alignment hole may position-align the cell-unit mask on the basis of a TFT position of TFT glass and determine a welding position of the cell-unit mask.

The deposition area may be hole-processed by any one of wet etching, electroplating, and laser machining.

A hybrid stick mask according to another embodiment of the present invention includes a structural stick mask including a plurality of opening portions formed to correspond to deposition areas of respective cell-unit masks in a first direction and tension-fixing portions provided on both ends in the first direction to be fixed to a frame while tension is applied. Here, the respective cell-unit masks may be separately coupled to the structural stick mask.

The structural stick mask may further include a reinforcing band provided on a rear surface of a bonding surface with the cell-unit mask to correct position distortion of the deposition area on the basis of a TFT position in the first direction.

Another aspect of the present invention provides a method of manufacturing the hybrid stick mask.

A method of manufacturing a hybrid stick mask according to one embodiment of the present invention includes a structural stick mask tensioning operation of tensioning a structural stick mask in a first direction, a cell-unit mask tensioning operation of tensioning the cell-unit mask in the first direction or in the first direction and a second direction perpendicularly intersecting with the first direction, a cell-unit mask aligning operation of position-aligning the cell-unit mask such that a deposition area of the cell-unit mask corresponds to an opening portion of the structural stick mask, and a cell-unit mask fixing operation of fixing the cell-unit mask to the structural stick mask. Here, in the cell-unit mask tensioning operation and the cell-unit mask fixing operation, such cell-unit masks may each be separately tensioned and fixed to the structural stick mask.

In the cell-unit mask fixing operation, a welding protrusion may be protrusively formed on a bottom surface of the structural stick mask when the cell-unit mask is coupled to the structural stick mask by a laser beam emitted from below.

In the cell-unit mask fixing operation, a welding protrusion may be protrusively formed on a basal surface of a welding groove of the cell-unit mask when the cell-unit mask is coupled to the structural stick mask by a laser beam emitted from above. Also, the welding groove may be one surface of the cell-unit mask and formed to be stepped, with a certain depth, from a contact surface with TFT glass.

Still another aspect of the present invention provides a mask assembly using the hybrid stick mask.

A mask assembly according to one embodiment of the present invention includes a frame including an opening portion and a third bonding area provided along a periphery of the opening portion and a plurality of hybrid stick masks having both ends fixed to the third bonding area while tension is applied in a first direction. Here, the hybrid stick masks may be formed using the hybrid stick mask according to any one of claims 1 to 13.

The mask assembly may further include a support portion provided in the first direction between the frame and the hybrid stick masks and configured to support and fix the hybrid stick masks and block a gap between the hybrid stick masks adjacent to each other.

Yet another aspect of the present invention provides an organic light emitting diode (OLED) display formed using the hybrid stick mask.

An OLED display according to one embodiment of the present invention includes TFT glass, a plurality of TFTs arranged on the TFT glass, a plurality of pixel electrodes electrically connected to the TFTs, deposition layers disposed on the pixel electrodes, and counter electrodes arranged on the deposition layers. Here, at least one of the TFTs, the pixel electrodes, the deposition layers, and the counter electrodes is formed using the hybrid stick mask according to any one of claims 1 to 13.

Advantageous Effects

According to embodiments of the present invention, there is an advantage of utilizing an existing stick mask type frame and a stick mask type tension system as a hybrid stick mask.

Also, according to one embodiment of the present invention, there are advantages such as manufacturing convenience, reduction in manufacturing costs, and improvement in productivity and qualities by dualizing an existing stick into a structural stick mask and a cell-unit mask to have a difference in manufacturing errors between the structural stick mask and the cell-unit mask.

Also, according to one embodiment of the present invention, since an existing stick mask is dualized into a structural stick mask and a cell-unit mask, small and thin cell-unit masks may be allowed to be manufactured and thus may be manufactured through electroplating or laser machining in addition to existing wet etching to manufacture a display using a high resolution mask.

Also, according to one embodiment of the present invention, a thickness of a deposition area of a cell-unit mask may be decreased according to a difference in thicknesses of a structural stick mask and the cell-unit mask to perform high resolution hole processing and minimize a shadow phenomenon while damage during tensioning and welding may be prevented by increasing the thickness of the structural stick mask configured for support, and a large-area OLED display with high resolution may be easily implemented.

Also, according to one embodiment of the present invention, since a thickness of a structural stick mask is increased or an additional reinforcing band is provided, even when a cell-unit mask to which tension is applied is coupled, a rib of the structural stick mask may not be bent by the tension and position deformation of the cell-unit mask may be minimized to implement a large-area mask assembly.

Also, according to one embodiment of the present invention, since a thickness of a structural stick mask is increased or an additional reinforcing band is provided, adhesion between thin film transistor (TFT) glass and a hybrid stick mask may be increased to reduce a shadow phenomenon.

Also, according to one embodiment of the present invention, since a structural stick mask and a cell-unit mask are allowed to have different thermal expansion coefficients, occurrence of displacement of the cell-unit mask caused by heat applied in a process of manufacturing a hybrid stick mask and a mask assembly and a deposition process inside a depositor may be relatively minimized.

Also, according to one embodiment of the present invention, since a structural stick mask and a cell-unit mask are allowed to have different thicknesses, it is possible to embody the cell-unit mask to be thinner than an existing stick mask to increase productivity and reliability of a large-area high resolution precise deposition pattern Also, according to one embodiment of the present invention, when some cell-unit masks of a hybrid stick mask including a plurality of cell-unit masks are replaced, it is necessary to consider only other cell-unit masks in one direction and it is unnecessary to consider an interference phenomenon with cell-unit masks of another adjacent hybrid stick mask, which facilitates maintenance and repair.

Also, according to one embodiment of the present invention, since welding protrusions are formed, by welding, on a bottom surface of a structural stick mask which is a rear surface of a contact surface with TFT glass, the TFT glass may be pressed against a hybrid stick mask without a gap to reduce deposition failures.

Also, according to one embodiment of the present invention, although a welding groove is provided to be recessed, at a certain depth, from a contact surface and welding protrusions are formed on a basal surface of the welding groove, top ends of the welding protrusions are formed to be lower than the contact surface so that the hybrid stick mask may be pressed against TFT glass without a gap on a contact surface with the TFT glass and deposition failures may be reduced.

Also, according to one embodiment of the present invention, since cell-unit masks are separately embodied, tension may be applied to the cell-unit mask in a first direction as well as a second direction to more precisely control a total pitch of the mask.

---

Figure 1:
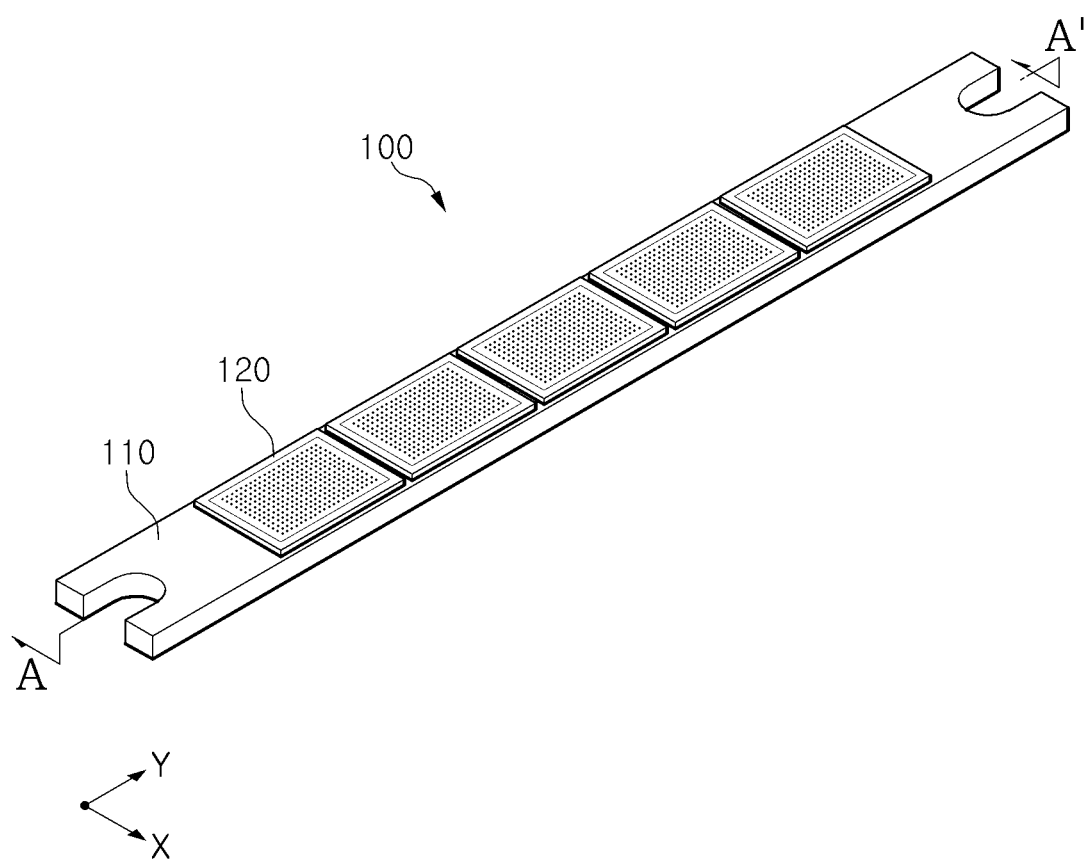
FIG. 1 is a perspective view illustrating a hybrid stick mask according to a first embodiment of the present invention.

1: organic light emitting diode (OLED) display
10: mask assembly
100: hybrid stick mask
110: structural stick mask
112: first bonding area
114a, 114b: reinforcing band
120: cell-unit mask
122: position alignment hole
124: contact surface with thin film transistor (TFT) glass
126: welding protrusion
200: frame
220: third bonding area
t1: thickness of structural stick mask
t3: step between contact surface and top end of welding protrusion
111: opening portion
113: tension-fixing portion
115: welding protrusion
121: deposition area
123: second bonding area
125: welding groove
210: opening portion
230: support portion
t2: thickness of cell-unit mask

BEST MODE

One aspect of the present invention provides a hybrid stick mask.

A hybrid stick mask according to one embodiment of the present invention includes a structural stick mask including a plurality of opening portions formed in a first direction, a first bonding area provided along a periphery of the opening portion, and tension-fixing portions provided on both ends in the first direction to be fixed to a frame while tension is applied and a cell-unit mask including a deposition area corresponding to the opening portion and a second bonding area provided on a periphery of the deposition area and bonded to the first bonding area. Here, such cell-unit masks may be separately coupled to the structural stick mask.

A hybrid stick mask according to another embodiment of the present invention includes a structural stick mask including a plurality of opening portions formed to correspond to deposition areas of respective cell-unit masks in a first direction and tension-fixing portions provided on both ends in the first direction to be fixed to a frame while tension is applied. Here, the respective cell-unit masks may be separately coupled to the structural stick mask.

A method of manufacturing a hybrid stick mask according to one embodiment of the present invention includes a structural stick mask tensioning operation of tensioning a structural stick mask in a first direction, a cell-unit mask tensioning operation of tensioning the cell-unit mask in the first direction or in the first direction and a second direction perpendicularly intersecting with the first direction, a cell-unit mask aligning operation of position-aligning the cell-unit mask such that a deposition area of the cell-unit mask corresponds to an opening portion of the structural stick mask, and a cell-unit mask fixing operation of fixing the cell-unit mask to the structural stick mask. Here, in the cell-unit mask tensioning operation and the cell-unit mask fixing operation, such cell-unit masks may each be separately tensioned and fixed to the structural stick mask.

A mask assembly according to one embodiment of the present invention includes a frame including an opening portion and a third bonding area provided along a periphery of the opening portion and a plurality of hybrid stick masks having both ends fixed to the third bonding area while tension is applied in a first direction. Here, the hybrid stick masks may be formed using the hybrid stick mask according to any one of claims 1 to 13.

One aspect of the present invention provides an organic light emitting diode (OLED) display formed using a hybrid stick mask.

An OLED display according to one embodiment of the present invention includes thin film transistor (TFT) glass, a plurality of TFTs arranged on the TFT glass, a plurality of pixel electrodes electrically connected to the TFTs, deposition layers disposed on the pixel electrodes, and counter electrodes arranged on the deposition layers. Here, at least one of the TFTs, the pixel electrodes, the deposition layers, and the counter electrodes is formed using the hybrid stick mask according to any one of claims 1 to 13.

Modes of the Invention

Hereinafter, exemplary embodiments of the present invention will be described in detail with reference to the drawings. However, the technical concept of the present invention is not limited to the embodiments described hereinafter and may be embodied in another form. It should be noted that the embodiments explained herein are provided to make the disclosure through and complete and to allow the concept of the present invention to be understood adequately by those skilled in the art.

In the specification, when it is stated that one element is on another element, it means that the one element may be directly formed on the other element or a third element may be interposed therebetween. In addition, throughout the drawings, shapes and sizes are exaggerated for effective description of the technical content.

Also, although the terms first, second, third, and the like are used for describing a variety of elements in a variety of embodiments of the specification, these elements should not be limited by these terms. The terms are used only for distinguishing any one element from another element. Accordingly, an element called a first element in any one embodiment may be called a second element in another embodiment. Each embodiment explained and exemplified herein includes a complementary embodiment thereof. Also, in the specification, the term "and/or" is used to mean that at least one of elements listed therebefore and thereafter is included.

Throughout the specification, singular expressions, unless clearly defined otherwise in context, include plural expressions. Also, the terms "comprise," "have," and the like are used herein to specify the presence of stated features, numbers, stages, elements, or combinations thereof but do not preclude the presence or addition of one or more other features, numbers, stages, elements, or combinations thereof. Also, herein, the term "connect" is used to refer to both indirect connection and direct connection of a plurality of elements.

Also, hereafter, a detailed description of well-known functions or components of the related art will be omitted when it is considered to obscure the essence of the present invention.

Hereafter, for convenience of description, it is assumed that a hybrid stick mask is used for a horizontal deposition system but the present invention is not limited thereto. In the horizontal deposition system, a first direction is along a Y-axis of rectangular coordinates in a longitudinal direction of a hybrid stick mask, a second direction is along an X-axis of rectangular coordinates in a widthwise direction of the hybrid stick mask, and a deposition source, a mask assembly including the hybrid stick mask and thin film transistor (TFT) glass that is a body on which deposition is performed are located sequentially on a Z-axis in a vertical direction.

Hereinafter, a hybrid stick mask 100 according to a first embodiment of the present invention will be described.

Figure 2:
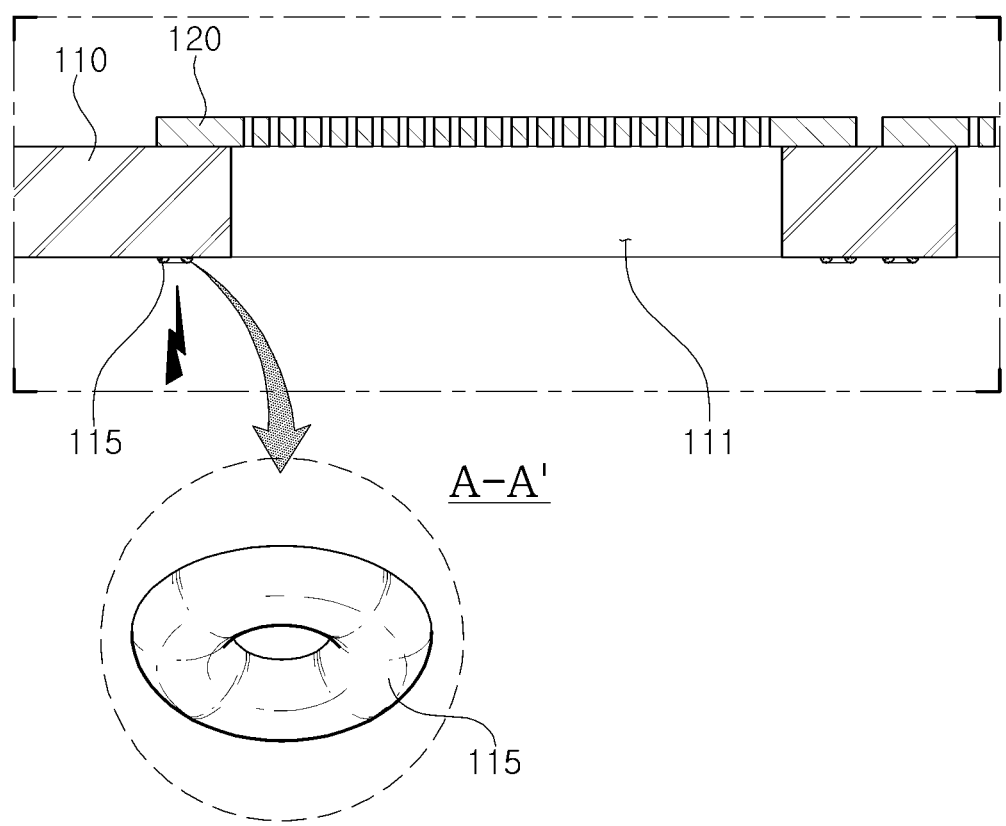
FIG. 2 is a partially enlarged cross-sectional view illustrating part A-A' of FIG. 1.
Figure 3:
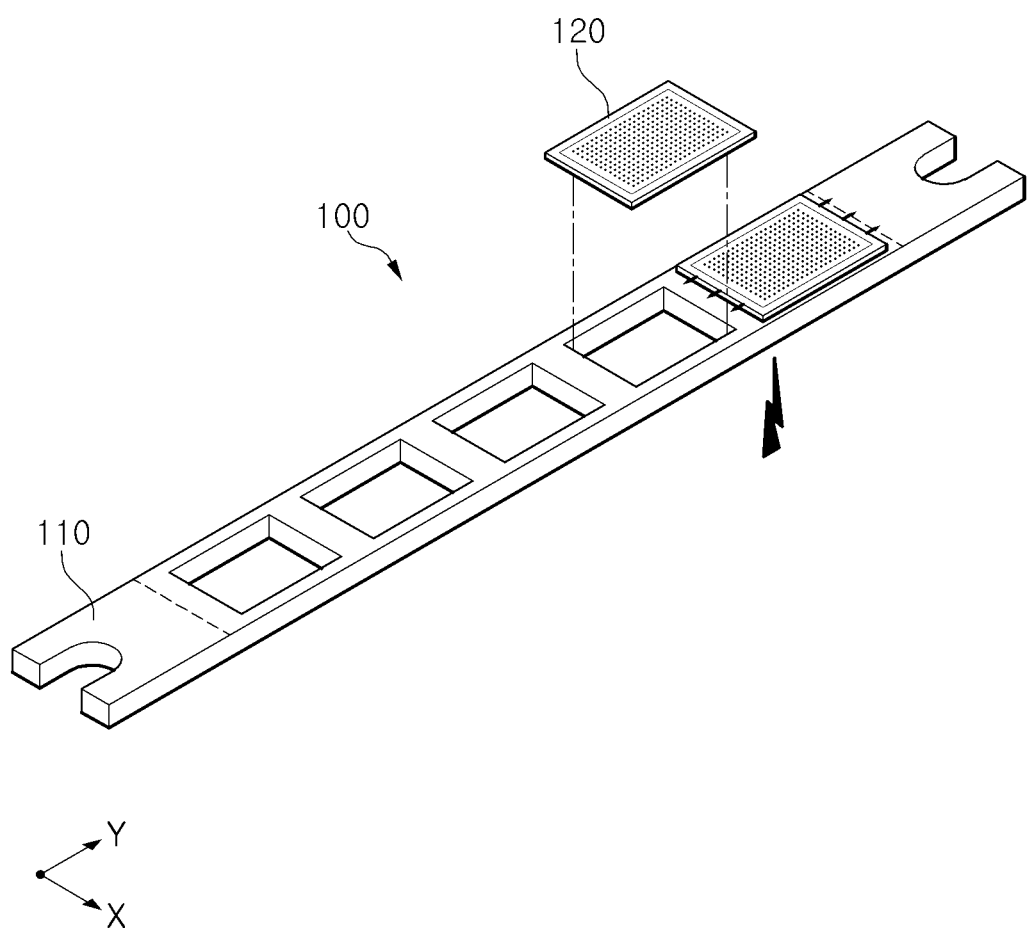
FIG. 3 is a manufacturing process view illustrating a cell-unit mask tension-bonded to a structural stick mask according to the first embodiment of the present invention.
Figure 4:
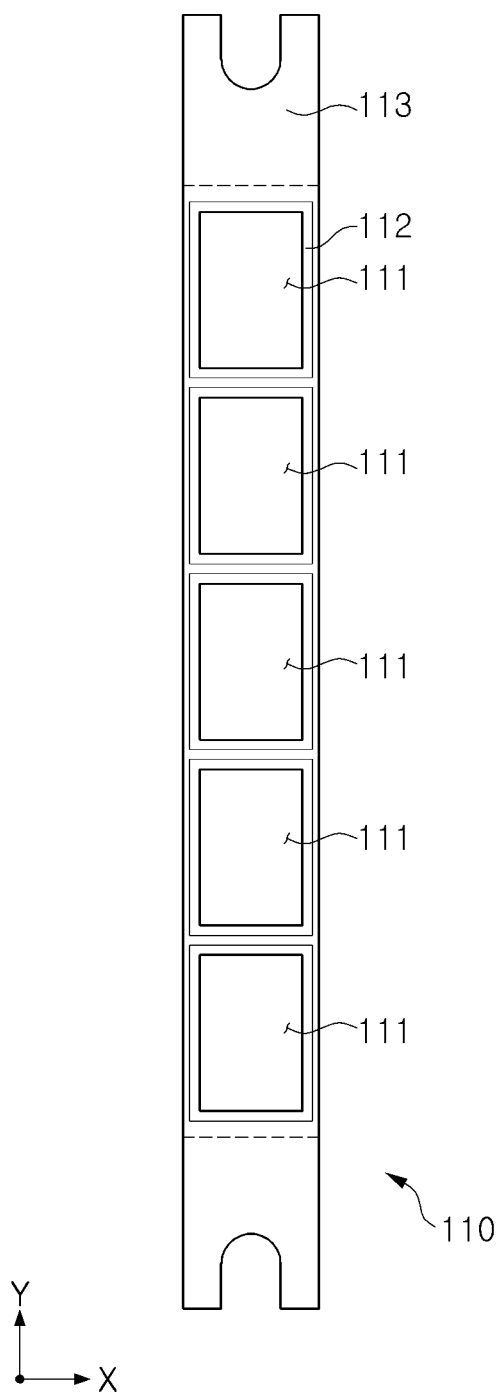
FIG. 4 is a plane view illustrating the structural stick mask according to the first embodiment of the present invention.
Figure 5:
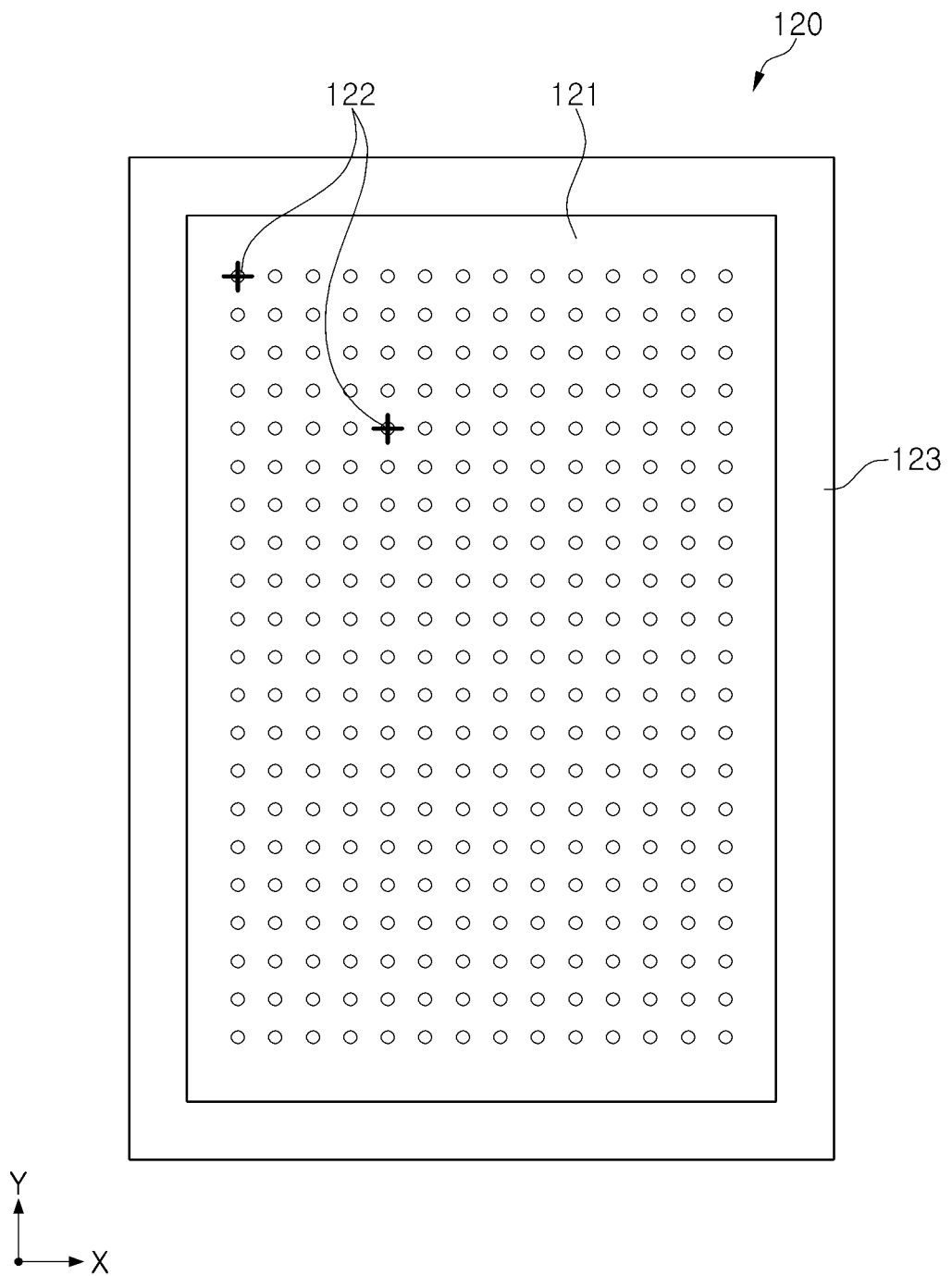
FIG. 5 is a plane view illustrating the cell-unit mask according to the first embodiment of the present invention.

FIG. 1 is a perspective view illustrating the hybrid stick mask 100 according to a first embodiment of the present invention, FIG. 2 is a partially enlarged cross-sectional view illustrating part A-A' of FIG. 1, FIG. 3 is a manufacturing process view illustrating a cell-unit mask 120 tension-bonded to a structural stick mask 110 according to the first embodiment of the present invention, FIG. 4 is a plane view illustrating the structural stick mask according to the first embodiment of the present invention, and FIG. 5 is a plane view illustrating the cell-unit mask according to the first embodiment of the present invention.

Referring to FIGS. 1 to 5, the hybrid stick mask 100 according to the first embodiment of the present invention may be used in a deposition process of depositing deposition materials on TFT glass (not shown). A substrate S may be a transparent material, for example, a glass material, a plastic material, or a metal material. However, in the present invention, among a variety of types of substrates S, the TFT glass will be described as an example. Accordingly, the present invention is not limited thereto.

The hybrid stick mask 100 may include the structural stick mask 110 and a plurality of such cell-unit masks 120. In the case of a horizontal deposition system, the hybrid stick mask 100 may have a structure in which the structural stick mask 110 and the cell-unit masks 120 on a top surface thereof are deposited in a vertical direction. The hybrid stick mask 100 may be replaced by the cell-unit mask 120 or the structural stick mask 110 which will be described below.

Structural Stick Mask 110

Referring to FIGS. 1 to 5 and 22 to 25, the structural stick mask 110 according to the first embodiment of the present invention may maintain a uniform total pitch that is a manufacturing tolerance of the cell-unit mask 120 which will be described below. The structural stick mask 110 may be fixed to a frame 200 while tension is applied and support the cell-unit masks 120. The structural stick mask 110 may include a plurality of opening portions 111 formed in the first direction. Also, the structural stick mask 110 may include a first bonding area 112 and a tension-fixing portion 113. In addition, welding protrusions 115 may be further included.

Referring back to FIGS. 2 to 5, the opening portion 111 may expose a deposition area 121 of the cell-unit mask 120 in a Z direction. The opening portion 111 may have a vertically penetrating shape. The plurality of opening portions 111 may be spaced apart from each other by a rib. The opening portion 111 may be formed to have a size and shape corresponding to the deposition area 121 of the cell-unit mask 120. One opening portion 111 may correspond to each cell-unit mask 120. The respective opening portions 111 may form a symmetrical array in the first direction. The opening portion 111 may be processed with lower precision than the deposition area 121 of the cell-unit mask 120.

The opening portions 111 have quadrangular shapes for manufacturing and processing convenience, but do not necessarily have to have quadrangular shapes, and may have, for example, different or irregular sizes. Also, an opening portion edge surrounding the opening portion 111 may have a tilted surface gradually narrowing in a Z+ direction to increase a chamfer rate according to a certain thickness of the structural stick mask 110 according to the first embodiment.

Referring back to FIGS. 4 and 5, the first bonding area 112 may provide an area supporting the cell-unit mask 120 and bonded to a second bonding area 123 of the cell-unit mask 120. The first bonding area 112 may be provided along a periphery of the opening portion 111. The bonding area 112 may come into surface contact with the second bonding area 123 which will be described below and support the cell-unit mask 120. The structural stick mask 110 and the cell-unit mask 120 may be bonded by welding between the first bonding area 112 and the second bonding area 123. The first bonding area 112 may have a quadrangular shape. The first bonding area 112 according to one embodiment may have different widths in the first direction and the second direction.

Referring back to FIG. 4, the tension-fixing portions 113 may be areas protruding and extending from both ends of the structural stick mask 110. The tension-fixing portions 113 may be areas bitten by clamp devices (not shown) provided on both ends in the first direction to apply tension to the structural stick mask 110. An area of the tension-fixing portion 113 which is bitten by the clamp device may have wing shapes symmetrical to each other. The tension-fixing portion 113 may include an area welded by a laser beam of a laser welder (not shown) provided at an upper portion in the Z direction. The tension-fixing portion 113 may be fixed to the frame 200 by welding while tension is applied.

In this case, to the clamp device may be provided on each of the tension-fixing portions 113 to tension the structural stick mask 110. The clamp device applies tension to the tension-fixing portion 113 in the first direction to fix the structural stick mask 110 to the frame 200 while the structural stick mask 110 is tightly pulled. The tension-fixing portion 113 may include a fixing area to be coupled to the frame 200. Here, fixing to the frame 200 may be performed by welding or the like.

Referring back to FIGS. 2 and 3, the welding protrusion 115 may be protrusively formed on a bottom surface of the structural stick mask 110, that is, a rear surface of a bonding surface between the structural stick mask 110 and the cell-unit mask 120, to increase adhesion between the cell-unit mask 120 and the TFT glass. To this end, when the cell-unit mask 120 is coupled to the structural stick mask 110, a laser beam may be emitted from the rear surface of the bonding surface with the cell-unit mask 120, that is, the bottom surface in the Z+ direction, as shown in FIGS. 2 and 3. The welding protrusion 115 may be formed at a welding point. In this case, the welding point is an area in which the welding protrusion 115 is formed by the laser beam to couple each cell-unit mask 120 to the structural stick mask 110. A plurality of such welding protrusions 115 may be provided at certain intervals on the welding point.

A laser welding device (not shown) may be provided below the structural stick mask 110. The welding protrusions 115 may be formed on the rear surface of the bonding surface with the cell-unit mask 120 by a laser beam emitted by the laser welding device. Accordingly, an additional uneven part is not additionally generated on a contact surface 124 of the cell-unit mask 120 with the TFT glass which faces the TFT glass due to welding. Accordingly, even through a welding process, the TFT glass is pressed against the hybrid stick mask 100 in the deposition process and a gap does not occur, which minimizes a shadow phenomenon.

Referring back to FIGS. 1, 3, and 4, the structural stick mask 110 may have a stick shape having a certain length in the first direction. The structural stick mask 110 may be manufactured with a lower manufacturing tolerance than the cell-unit mask 120. Also, the structural stick mask 110 is manufactured with a low manufacturing tolerance in comparison to existing stick masks. The structural stick mask 110 may have a symmetrical width (breadth), shape, size, and the like to apply uniform tension to the cell-unit mask 120. The structural stick mask 110 may include a metal material including a steel component which has attraction acting on a magnetic substance.

The structural stick mask 110 may have magnetic properties. Accordingly, when the hybrid stick mask 100 is pressed against the TFT glass, adhesion between the TFT glass and the hybrid stick mask 100 may be increased by applying attraction to the hybrid stick mask 100 in the Z+ direction using a magnetic substance provided thereabove.

The structural stick mask 110 according to one embodiment may have a different thermal expansion coefficient from the cell-unit mask 120. In more detail, the structural stick mask 110 may have a relatively low thermal expansion coefficient in comparison to the cell-unit mask 120. Accordingly, since the structural stick mask 110 has the lower thermal expansion coefficient, distortion caused by heat generated in a vapor deposition process may be minimized.

According to one embodiment, the structural stick mask 110 may have a different thickness from the cell-unit mask 120. In more detail, the structural stick mask 110 may have a thickness relatively greater than or equal to a certain thickness in comparison to the cell-unit mask 120. Unlike the cell-unit mask 120, it is possible to prevent position distortion in tension and welding as well as damage caused by tension and welding by increasing the thickness of the structural stick mask 110. The structural stick mask 110 may have a thickness of 100 n to 200 µm.

The cell-unit mask 120, which is another component of the hybrid stick mask 100, will be described.

Cell-Unit Mask 120

Referring to FIGS. 1 to 5, in a deposition process, the cell-unit mask 120 allows a deposition material to pass through the deposition area 121 and be deposited on the TFT glass to form a thin film (a metal layer, organic light emitting layer, or the like) of a desired shape. As shown in FIG. 5, the cell-unit mask 120 may include the deposition area 121 and the second bonding area 123. In addition, position alignment holes 122 may be further included.

Referring back to FIGS. 1 to 3, the cell-unit mask 120 may be separately coupled to the structural stick mask 110. In this case, the respective cell-unit masks 120 may be intermittently arranged on the structural stick mask 110 in the first direction. That is, the plurality of cell-unit masks 120 may be bonded to the structural stick mask 110 while being spaced apart from each other in the first direction by a rib. The cell-unit mask 120 may have a panel-shaped thin film shape. The cell-unit mask 120 may have a thickness of 5 µm to 25 µm. The cell-unit mask 120 may be supported with one surface thereof in surface contact with the TFT glass and the other surface thereof bonded to the structural stick mask 110. According to one embodiment, in the horizontal type deposition system, the cell-unit mask 120 may be provided on a top surface of the structural stick mask 110 in the Z direction.

Referring back to FIGS. 1, 2, and 5, the deposition area 121 may include a plurality of pattern holes through which deposition materials pass. The deposition area 121 may have a position, size, and shape corresponding to the opening portion 111. The deposition area 121 may have a smaller area than the opening portion 111 in the first direction and the second direction. The opening portion 111 of the structural stick mask 110 may be formed to be larger than the deposition area 121 and smaller than the cell-unit mask 120. The deposition area 121 has been described as an array of a plurality of holes but may include a plurality of slit shapes. The deposition area 121 may include the position alignment holes 122.

The deposition area 121 may be hole-processed using any one of wet etching, electroplating, and laser machining. That is, since small and thin cell-unit masks 120 may be allowed to be manufactured, it is possible to process the cell-unit mask 120 including the precise deposition area 121 through wet etching, electroplating, or laser machining.

Referring back to FIG. 5, the second bonding area 123 may provide an area bonded to the structural stick mask 110. The second bonding area 123 may be provided along a periphery of the deposition area 121. The second bonding area 123 may be an area of the cell-unit mask 120 excluding the deposition area 121. Referring back to FIGS. 3 to 5, the second bonding area 123 may be an area which comes into surface contact with the first bonding area 112.

The second bonding area 123 may be supported by the first bonding area 112. The structural stick mask 110 and the cell-unit mask 120 may be bonded by welding between the first bonding area 112 and the second bonding area 123. The second bonding area 123 may have a quadrangular shape.

The second bonding area 123 according to one embodiment may have different widths in the first direction and the second direction.

Referring back to FIG. 5, the position alignment holes 122 may include holes selected from R, G, and B pixels of an organic light emitting diode (OLED) display to allow a deposition material to pass therethrough. Also, the position alignment holes 122 may be a reference for position-aligning the cell-unit mask 120 on the basis of the TFT position of the TFT glass. The position alignment holes 122 may determine a welding position of the cell-unit mask 120. Since the position alignment holes 122 of the cell-unit mask 120 correspond to the TFT position of the TFT glass, the position of the cell-unit mask 120 may be aligned on the basis of an absolute coordinate value of the TFT position.

According to one embodiment, the cell-unit mask 120 may have a different thermal expansion coefficient from the structural stick mask 110. In more detail, the cell-unit mask 120 may have a relatively high thermal expansion coefficient in comparison to the structural stick mask 110. Accordingly, when tension is applied to the structural stick mask 110 in the first direction, deformation applied to the structural stick mask 110 may be relatively small in comparison to the cell-unit mask 120. Accordingly, a position transition of the cell-unit mask 120 having a high thermal expansion coefficient may be minimized while the structural stick mask 110 supports each of the cell-unit masks 120.

According to one embodiment, the cell-unit mask 120 may have a different thickness from the structural stick mask 110. In more detail, the cell-unit mask 120 may have a relatively small thickness in comparison to the structural stick mask 110 (t2<t1). Accordingly, the structural stick mask 110 may be pulled by applying stronger tension and sag of the structural stick mask 110 may be relatively reduced in comparison to the cell-unit mask 120. Consequentially, since the structural stick mask 110 supports the respective cell-unit masks 120, sag caused by a weight of the cell-unit mask 120 may be minimized. In this case, the cell-unit mask 120 may have a thickness of 5 μm to 25 μm.

Hereinafter, the hybrid stick mask 100 according to a second embodiment of the present invention will be described on the basis of differences from the hybrid stick mask 100 according to the first embodiment of the present invention. Omitted details may be understood with reference to the content of the hybrid stick mask 100 of the first embodiment described with reference to FIGS. 1 to 5.

The hybrid stick mask 100 according to the second embodiment of the present invention may have a feature in which a laser beam is emitted from above when the cell-unit mask 120 is coupled to the structural stick mask 110 to form welding protrusions 126 on a bottom portion of a welding groove 125 of the cell-unit mask 120.

Figure 6:
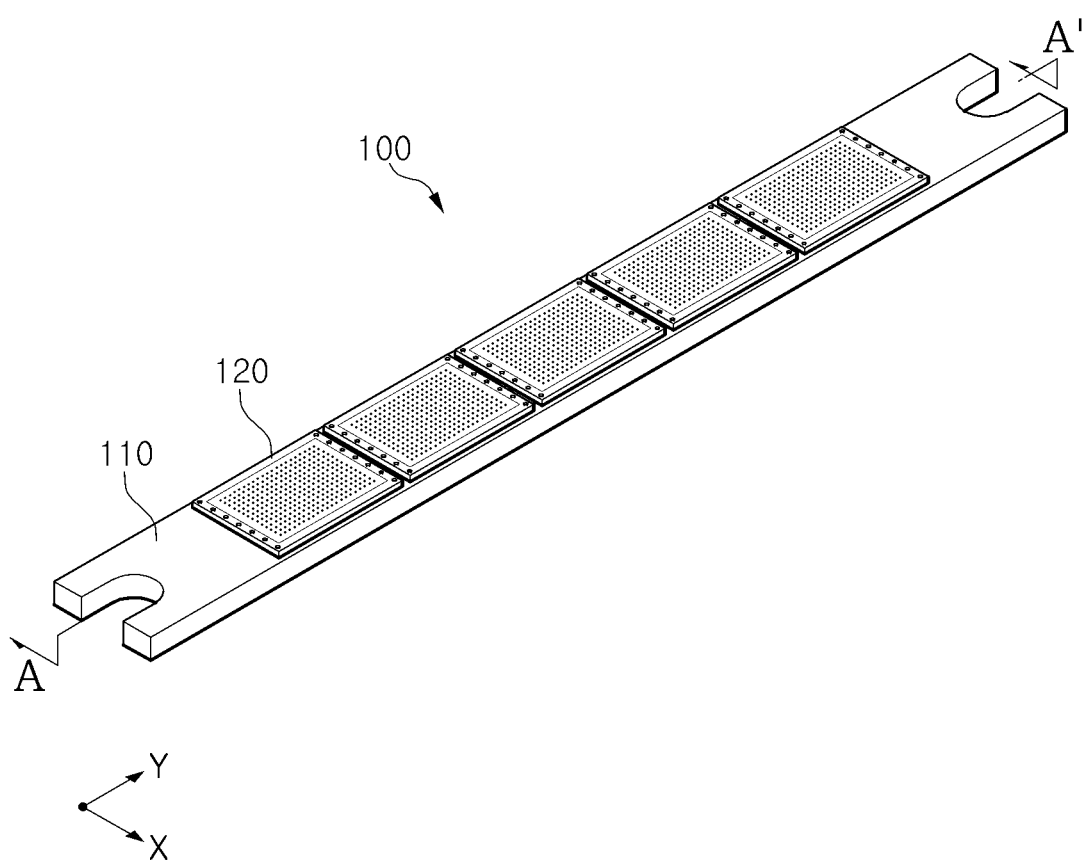
FIG. 6 is a perspective view illustrating a hybrid stick mask according to a second embodiment of the present invention.
Figure 7:
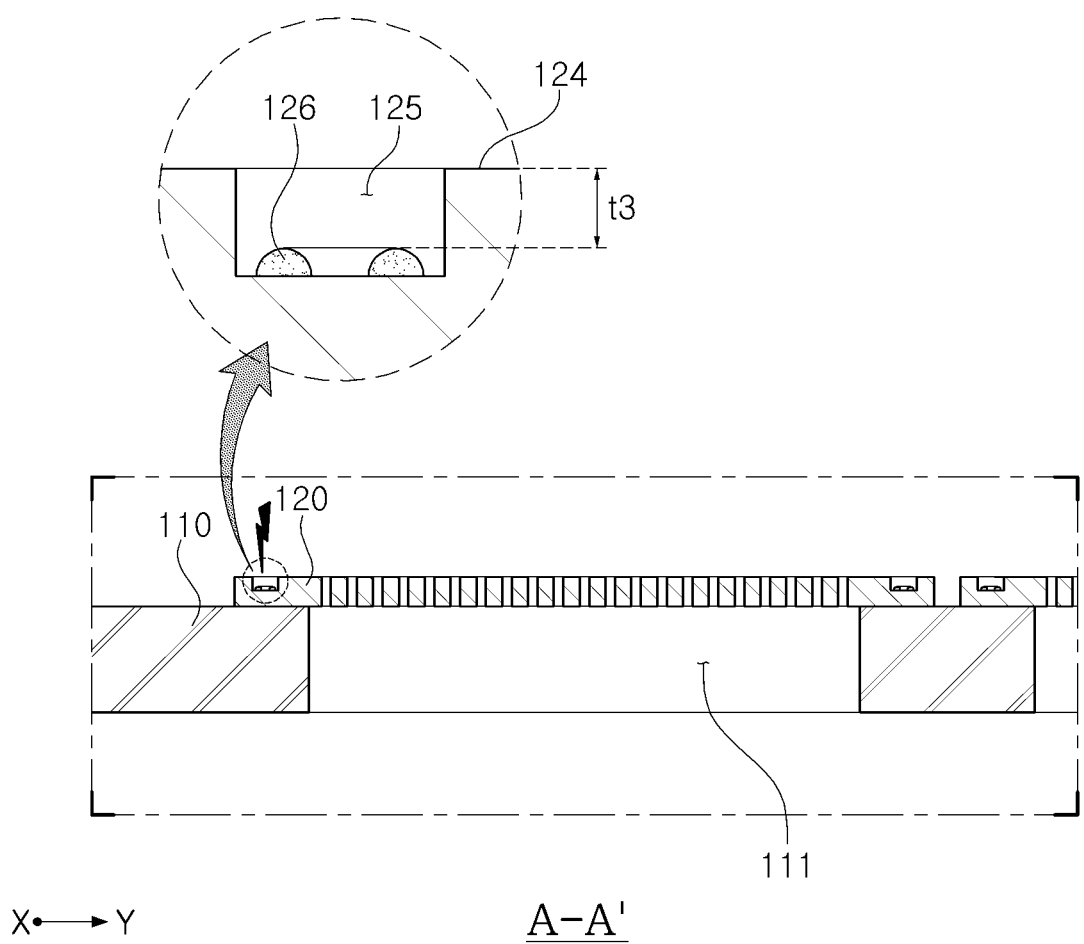
FIG. 7 is a partially enlarged cross-sectional view illustrating part A-A' of FIG. 6.
Figure 8:
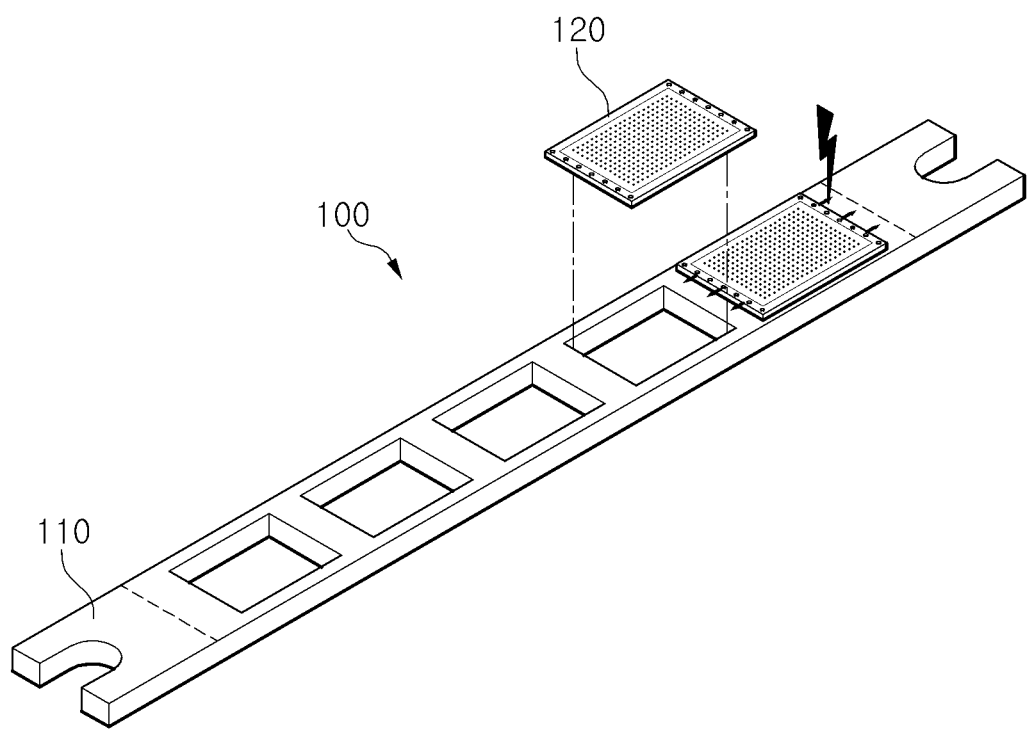
FIG. 8 is a manufacturing process view illustrating a cell-unit mask tension-bonded to a structural stick mask according to the second embodiment of the present invention.
Figure 9A:
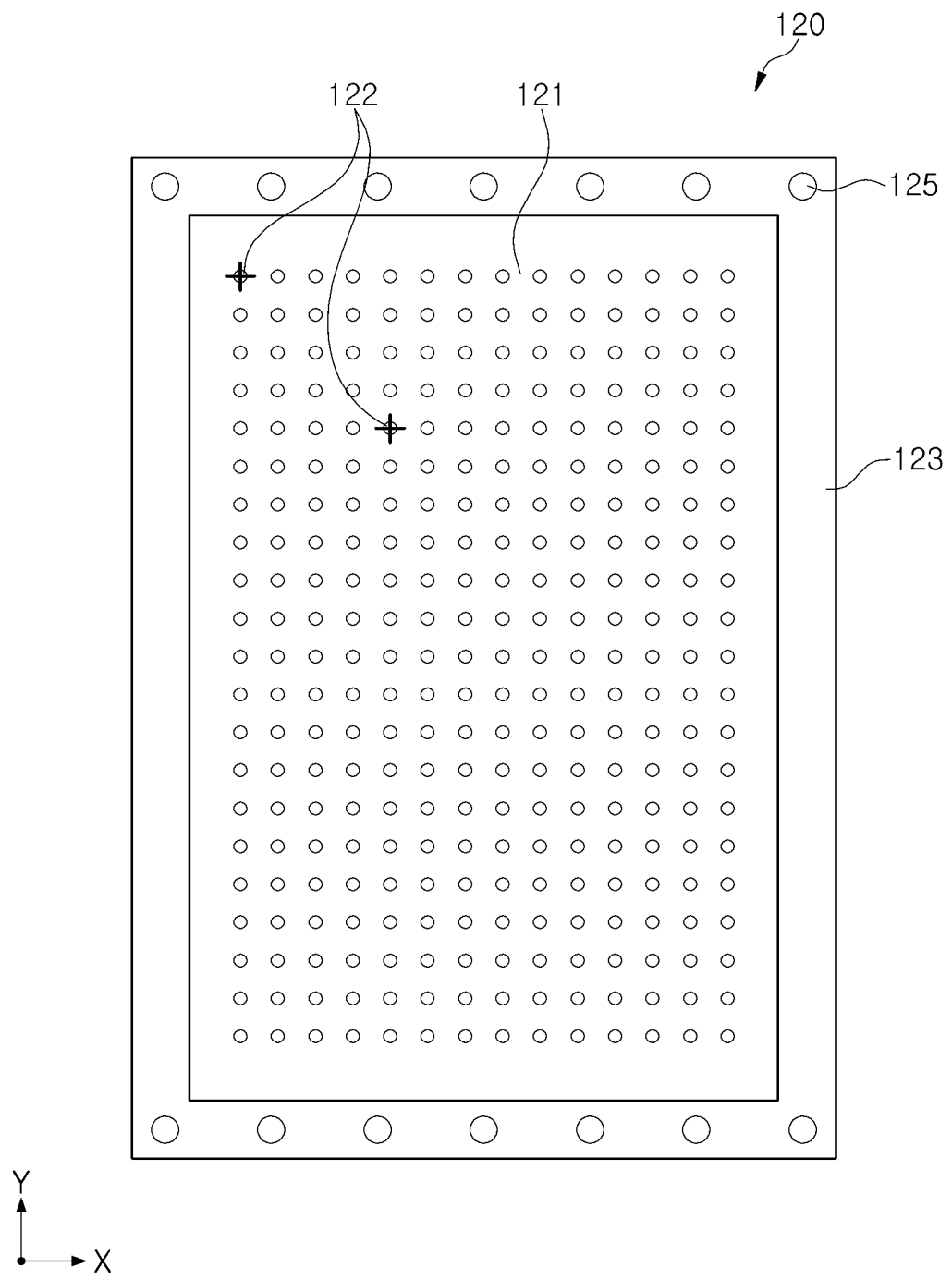
FIGS. 9A and 9B are plane views illustrating the cell-unit mask according to the second embodiment of the present invention.
Figure 9B:
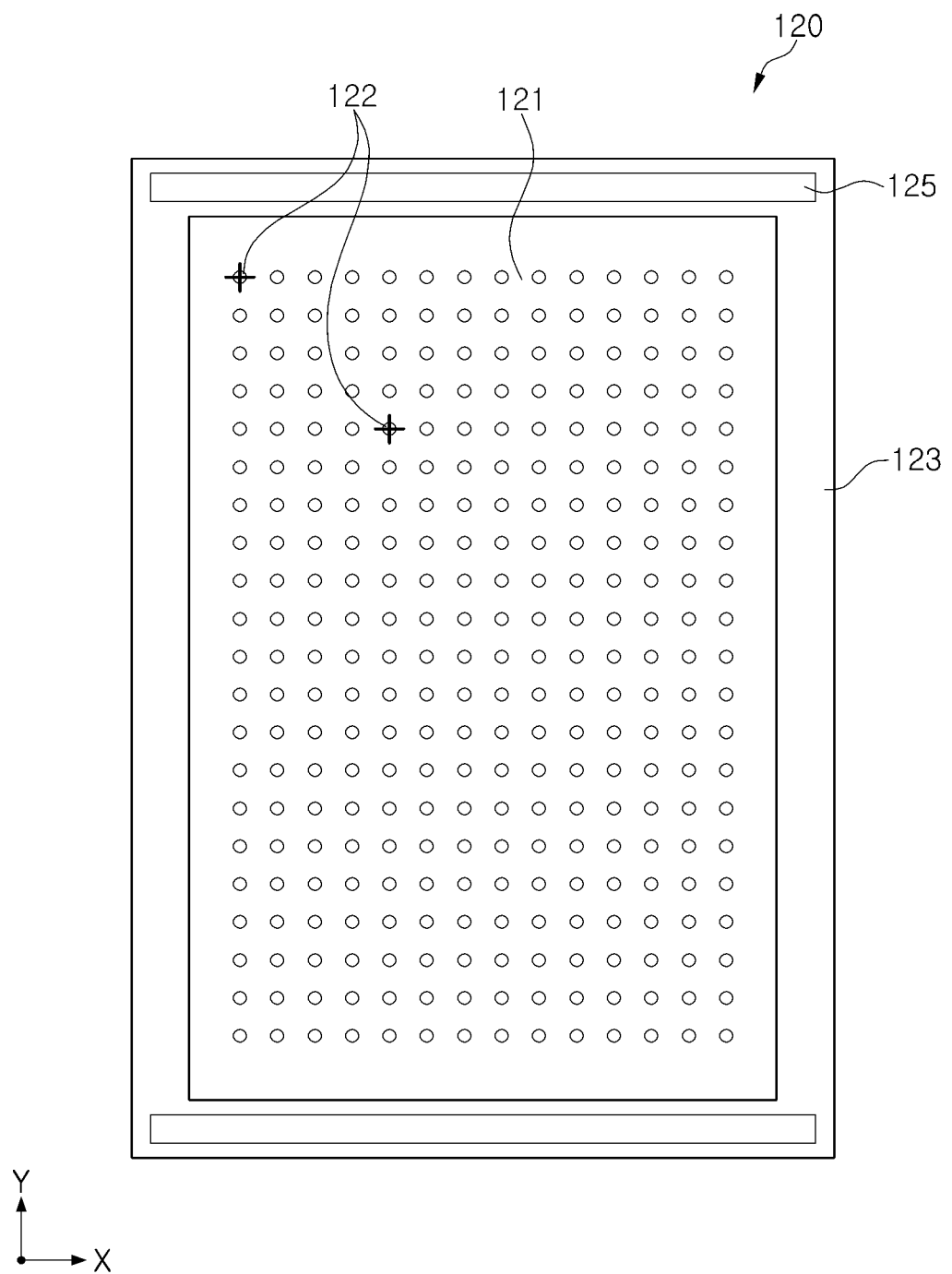

FIG. 6 is a perspective view illustrating the hybrid stick mask according to the second embodiment of the present invention, FIG. 7 is a partially enlarged cross-sectional view illustrating part A-A' of FIG. 6, FIG. 8 is a manufacturing process view illustrating a cell-unit mask tension-bonded to a structural stick mask according to the second embodiment of the present invention, and FIGS. 9A and 9B are plane views illustrating the cell-unit mask according to the second embodiment of the present invention.

Cell-Unit Mask 120

As shown in FIGS. 6 to 9B, the cell-unit mask 120 according to the second embodiment may include the welding groove 125.

The cell-unit mask 120 according to the second embodiment has a great thickness in comparison to the cell-unit mask 120 according to the first embodiment. That is, the cell-unit mask 120 according to the second embodiment may have a thickness greater than or equal to a certain thickness so as not to influence durability of the cell-unit mask 120 even when the welding groove 125 is formed.

Referring to FIGS. 7 and 8, the welding groove 125 may prevent a gap between the cell-unit mask 120 and the TFT glass which is caused by the welding protrusions 126 formed by welding when the cell-unit mask 120 and the structural stick mask 110 are coupled to each other. That is, the welding groove 125 may be provided to press the cell-unit mask 120 against the TFT glass without a gap in a deposition process even when weld-coupling is performed using the laser beam emitted from above. The welding groove 125 may be formed to have a step at a certain depth from a contact surface 124 with the TFT glass, which is one surface of the cell-unit mask 120.

As shown in FIG. 7, the welding groove 125 has a certain depth from the contact surface 124 with the TFT glass and may be an area in which the welding protrusions 126 which will be described below will be formed. The welding groove 125 having the step shown in FIGS. 9A and 9B may be manufactured to have a variety of shapes on a top of the contact surface 124 with the TFT glass.

Referring back to FIG. 7, the welding protrusions 126 may be protrusively formed on a basal surface of the welding groove 125. A top end of the welding protrusion 126 may be formed to be lower than the contact surface 124 with the TFT glass in order to increase adhesion between the cell-unit mask 120 and the TFT glass. In the Z direction, the contact surface 124 with the TFT glass is in the Z+ direction by t3 with respect to the top end of the welding protrusions 126.

Hereinafter, the hybrid stick mask 100 according to a third embodiment of the present invention will be described on the basis of differences from the hybrid stick mask 100 according to the first embodiment of the present invention. Omitted details may be understood with reference to the content of the hybrid stick mask 100 of the first embodiment described with reference to FIGS. 1 to 5.

The hybrid stick mask 100 according to the third embodiment of the present invention has a feature in which the structural stick mask 110 includes a reinforcing band 114a.

Figure 10:
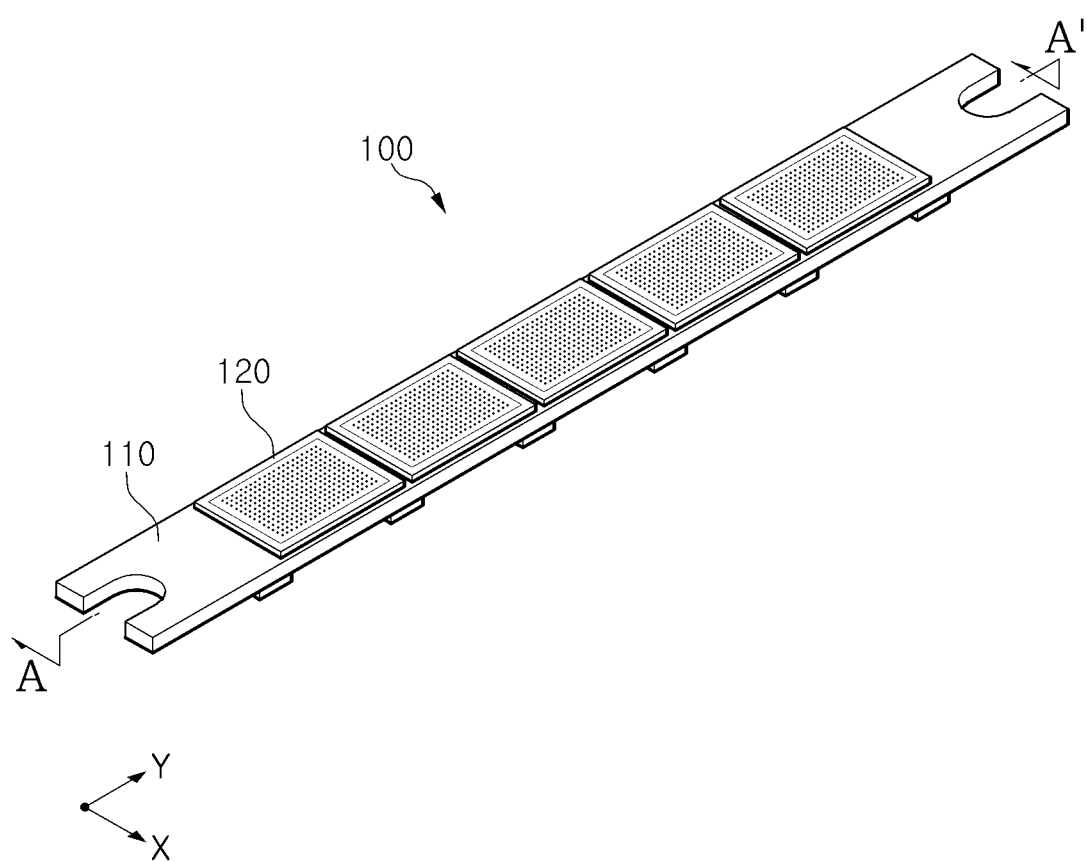
FIG. 10 is a perspective view illustrating a hybrid stick mask according to a third embodiment of the present invention.
Figure 11:
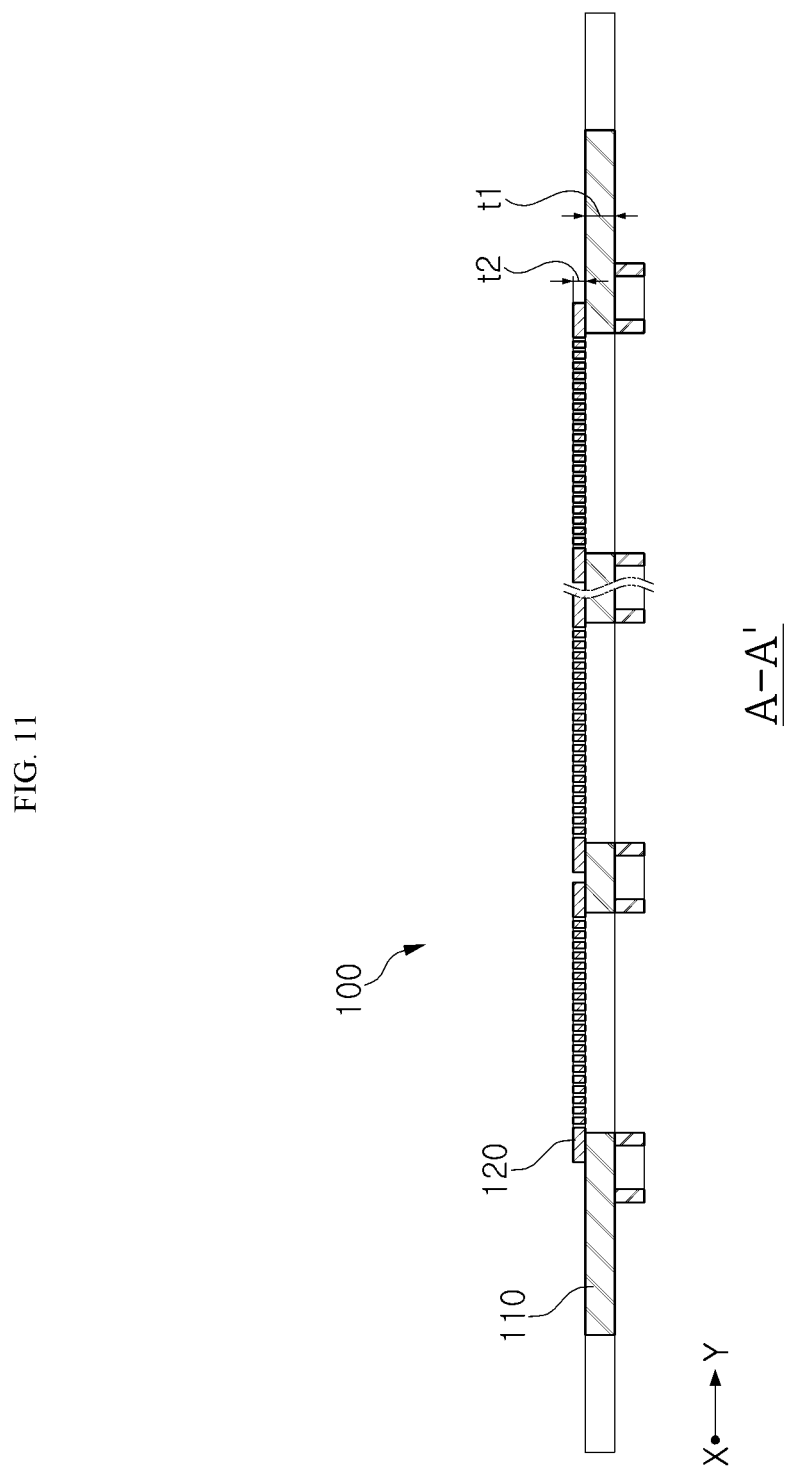
FIG. 11 is a cross-sectional view illustrating part A-A' of FIG. 10.
Figure 12:
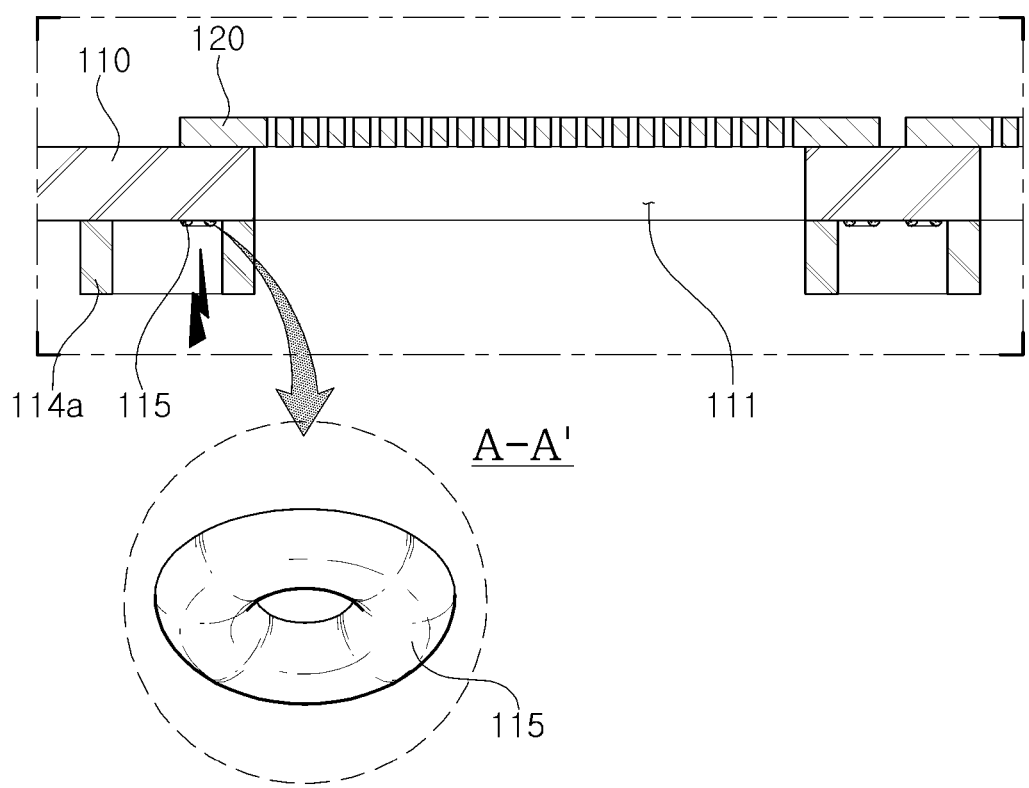
FIG. 12 is an enlarged cross-sectional view of part A-A' and illustrates the hybrid stick mask bonded by a laser beam emitted from a bottom surface according to the third embodiment of the present invention.
Figure 13:
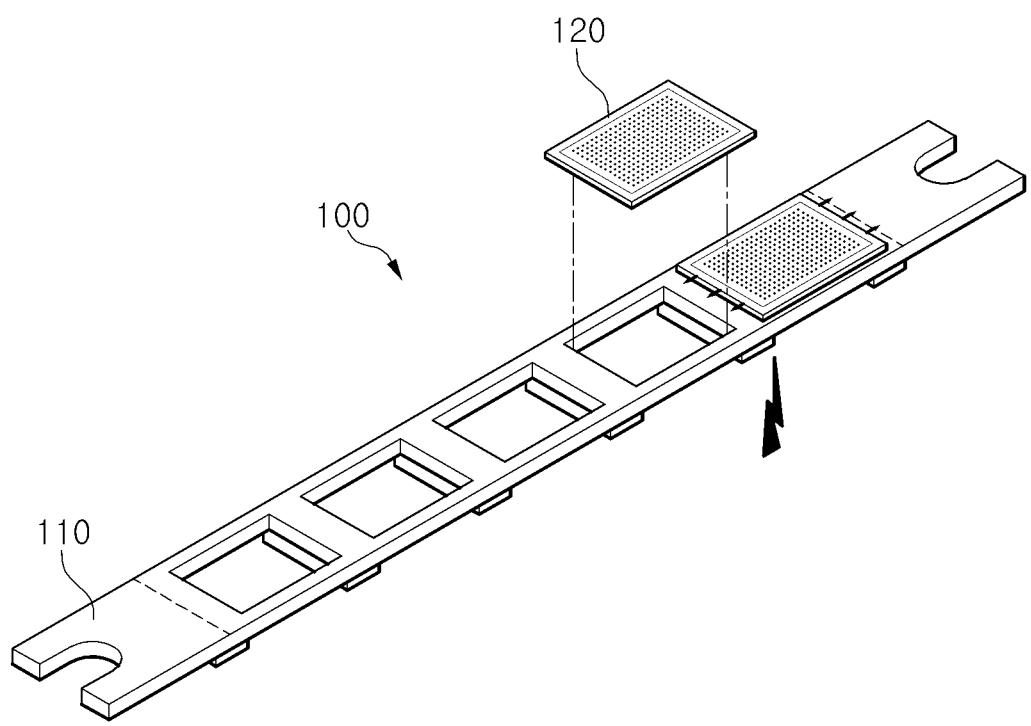
FIG. 13 is a manufacturing process view illustrating a cell-unit mask tension-bonded to a structural stick mask according to the third embodiment of the present invention.
Figure 14:
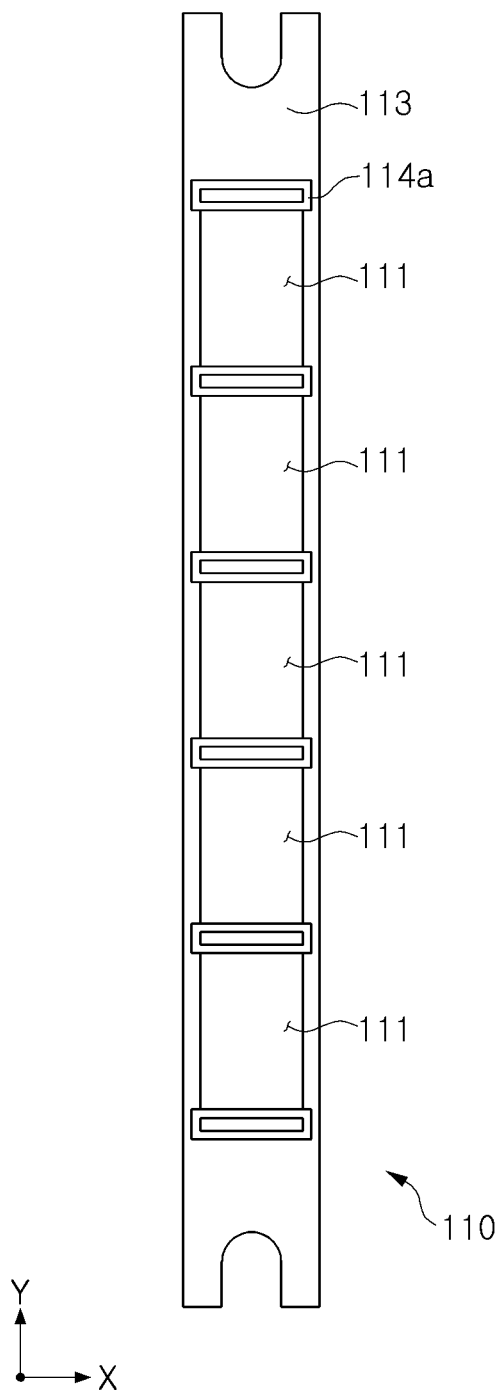
FIG. 14 is a bottom view illustrating the structural stick mask according to the third embodiment of the present invention.
Figure 15A:
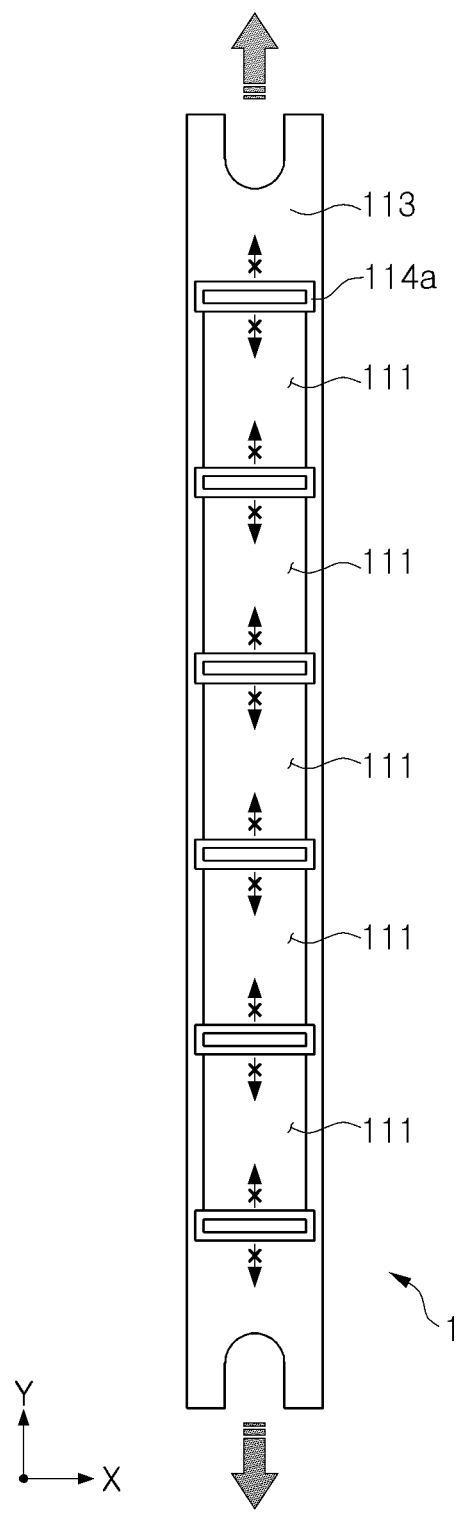
FIGS. 15A to 15C are schematic diagrams illustrating an action effect of a reinforcing band according to the third embodiment of the present invention.
Figure 15B:
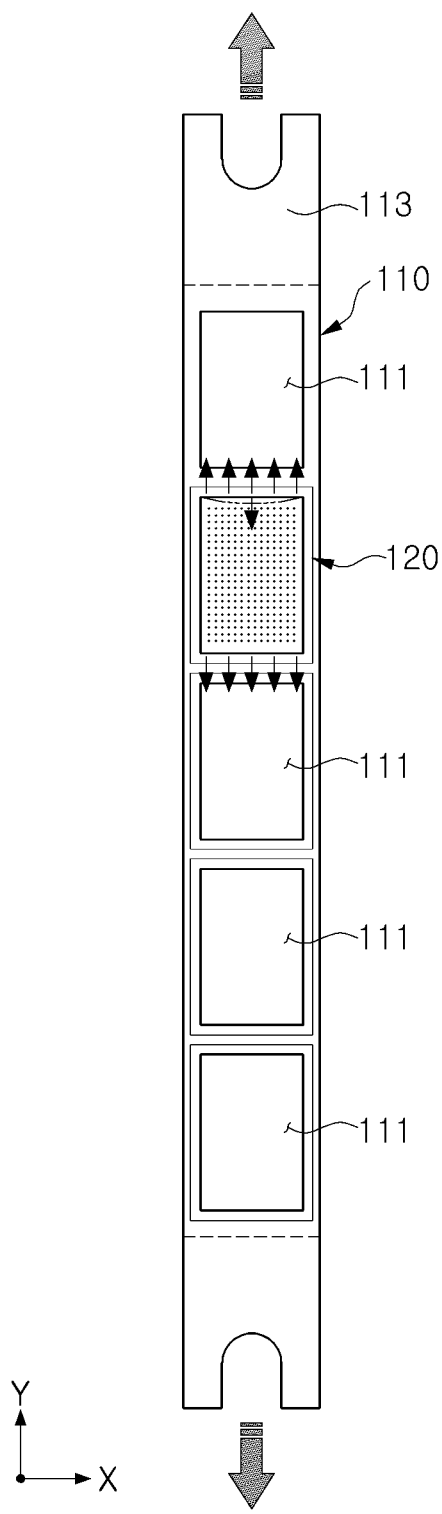
Figure 15C:
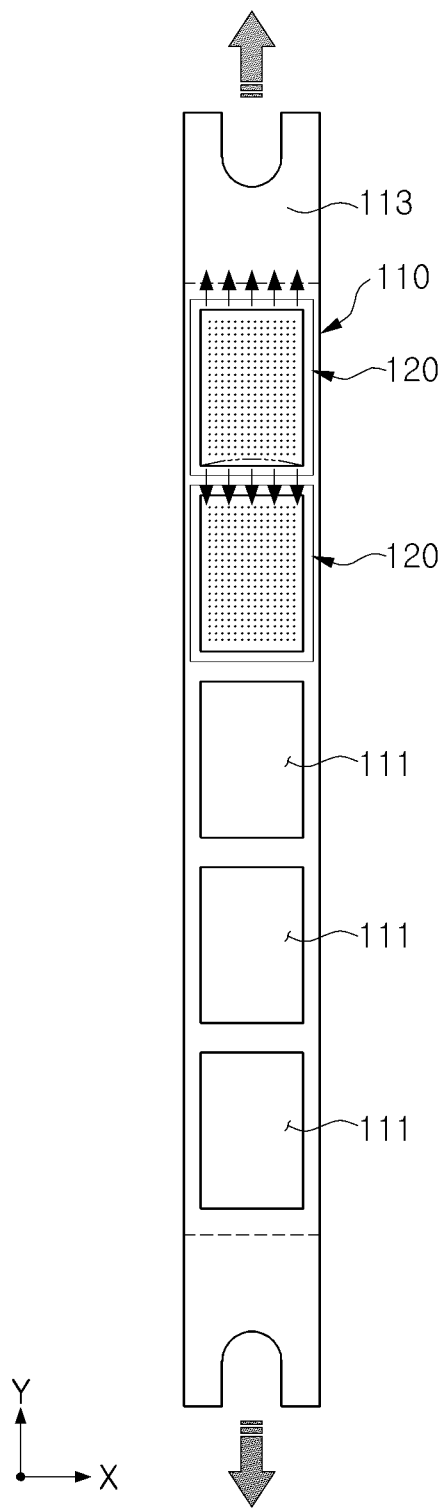
Figure 16:
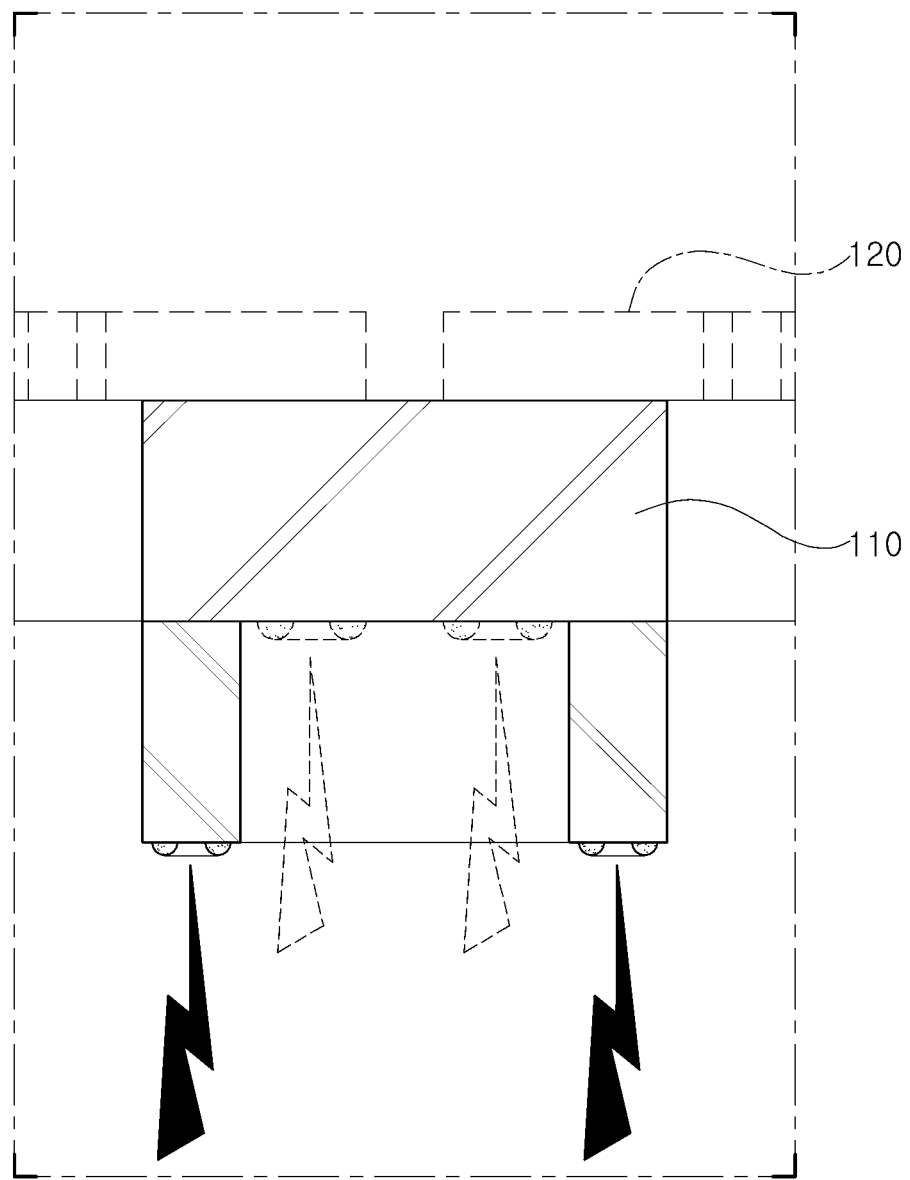
FIG. 16 is a schematic diagram illustrating a process of coupling the reinforcing band according to the third embodiment of the present invention.

FIG. 10 is a perspective view illustrating the hybrid stick mask 100 according to the third embodiment of the present invention, FIG. 11 is a cross-sectional view along line A-A in FIG. 10, FIG. 12 is an enlarged cross-sectional view of part A-A' and illustrates the hybrid stick mask 100 bonded by a laser beam emitted from a bottom surface according to the third embodiment of the present invention, FIG. 13 is a manufacturing process view illustrating the cell-unit mask 120 tension-bonded to the structural stick mask 110 according to the third embodiment of the present invention, FIG. 14 is a bottom view illustrating the structural stick mask 110 according to the third embodiment of the present invention, FIGS. 15A to 15C are schematic diagrams illustrating an action effect of the reinforcing band according to the third embodiment of the present invention, and FIG. 16 is a schematic diagram illustrating a process of coupling the reinforcing band according to the third embodiment of the present invention.

Structural Stick Mask 110

Referring to FIGS. 10 to 16, the structural stick mask 110 according to the third embodiment of the present invention may include the first bonding area 112 and the tension-fixing portion 113. In addition, the reinforcing band 114a and the welding protrusions 115 may be further included.

According to the third embodiment, the structural stick mask 110 may have a different thickness from the cell-unit mask 120. In more detail, the structural stick mask 110 may have a thickness relatively greater than or equal to a certain thickness in comparison to the cell-unit mask 120. Unlike the cell-unit mask 120, it is possible to prevent position distortion in tension and welding as well as damage caused by tension and welding by increasing the thickness of the structural stick mask 110. The structural stick mask 110 may have a thickness of 30 μm to 100 μm.

Referring back to FIGS. 11, 12, and 14, the reinforcing band 114a may correct position distortion of the cell-unit mask 120 which will be described below, and more particularly, the deposition area 121. Accordingly, the deposition area 121 may have a coordinate value corresponding to the TFT position of the TFT glass. The reinforcing band 114a may be provided on a rear surface of the bonding surface with the cell-unit mask 120. A plurality of such reinforcing bands 114a may be arranged in parallel and spaced apart from each other in the first direction. The reinforcing band 114a may have a thickness greater than or equal to a certain thickness in order to correct position distortion of the cell-unit mask 120.

The reinforcing bands 114a may have a certain rigidity so as not to be bent when coupled to the cell-unit mask 120. The reinforcing band 114a may have a low-weight material to prevent sag caused by the weight in the Z direction. Preferably, the reinforcing bands 114a may include a metal material including a steel component which has attraction acting on a magnetic substance.

Since the structural stick mask 110 and the reinforcing band 114a have magnetic properties, when the hybrid stick mask 100 is pressed against the TFT glass, attraction acts on the hybrid stick mask 100 in the Z+ direction due to the magnetic body provided above it to increase adhesion between the TFT glass and the hybrid stick mask 100.

As shown in FIG. 16, the reinforcing band 114a may be weld-coupled to the structural stick mask 110 by a laser beam emitted from a laser welder provided on a rear surface of the bonding surface with the structural stick mask 110, that is, below the structural stick mask 110.

The reinforcing band 114a according to the first embodiment may be a reinforcing wall. The reinforcing wall may be formed of a vertical wall surrounding a welding point. In order to avoid interference with the welding point for bonding with the cell-unit mask 120, welding protrusions may be formed at certain intervals on a bottom surface of the reinforcing wall along the reinforcing wall.

The welding point may provide a weld-coupling area for coupling the cell-unit mask 120 to the structural stick mask 110 by welding. When a laser beam is emitted toward the bottom surface of the structural stick mask 110, that is, the rear surface of the bonding surface with the cell-unit mask 120, an area of the corresponding welding point may be excluded to increase coupling force between the structural stick mask 110 and the cell-unit mask 120.

When tension is applied to the structural stick mask 110 in the first direction, the tension is applied only to an edge in the first direction to tension it and is not applied to a rib provided in the second direction which is an area between the edges.

FIGS. 15B and 15C are views illustrating cases in which, when the structural stick mask 110 does not include the reinforcing band 114a, the cell-unit masks 120 are tensioned, aligned, and welded to first and second opening portions 111 of the structural stick mask 110.

The cell-unit mask 120 to which tension is applied in the first direction or in the first direction and the second direction may be coupled to the second opening portion 111 of the structural stick mask 110. Here, particularly, when the tension applied to the cell-unit mask 120 in the first direction is released simultaneously with it being coupled, the rib to which the tension is not transferred may be deformed in a negative direction of the first direction as shown in FIG. 15B.

When the cell-unit mask 120 to which tension is applied in the first direction or in the first direction and the second direction is coupled to the first opening portion 111 of the structural stick mask 110 as shown in FIG. 15C, the tension applied to the cell-unit mask 120 is released simultaneously with it being coupled and the rib excluding the edge in the first direction may be deformed in a positive direction of the first direction which is opposite to the direction of FIG. 15B.

Accordingly, as shown in FIG. 15A, the reinforcing band 114a may perform a function of supporting the rib of the structural stick mask 110 to prevent deformation regardless of whether there is tension applied when the cell-unit mask 120 to which tension is applied is coupled to the structural stick mask 110.

The welding protrusion 115 may be formed on the welding point which is an area inside the reinforcing wall as shown FIGS. 11, 12, and 16. Since the welding protrusion 115 is provided inside the reinforcing band 114a, a coupling force between the structural stick mask 110 and the reinforcing band 114a as well as a coupling force between the structural stick mask 110 and the cell-unit mask 120 may be increased.

The welding protrusion 115 may be formed on the welding point inside the reinforcing band 114a by the laser welding device provided below the structural stick mask 110.

Hereinafter, the hybrid stick mask 100 according to a fourth embodiment of the present invention will be described on the basis of differences from the hybrid stick mask 100 according to the second and third embodiments of the present invention. Omitted details may be understood with reference to the content of the hybrid stick mask 100 of the first to third embodiments described with reference to FIGS. 1 to 16.

The hybrid stick mask 100 according to the fourth embodiment of the present invention has a feature in which the structural stick mask 110 includes a reinforcing band 114b.

Figure 17:
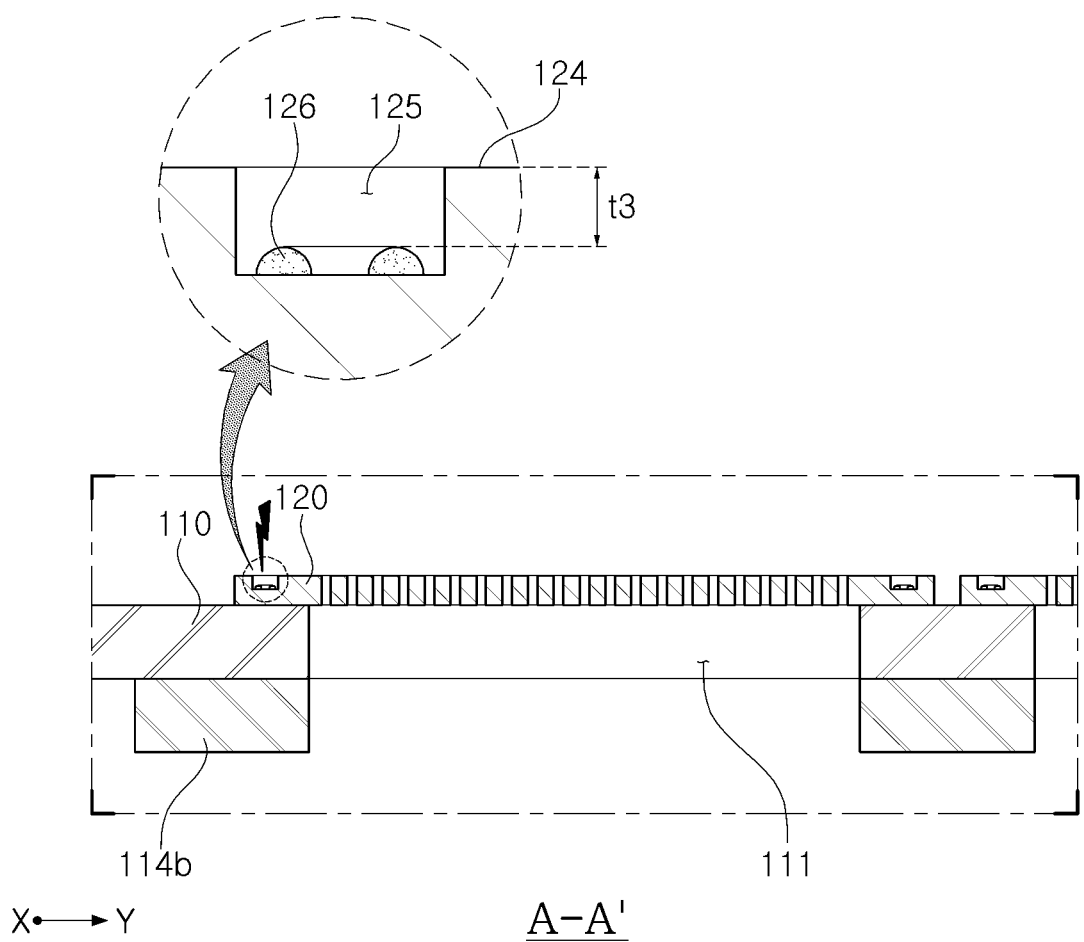
FIG. 17 is a perspective view illustrating a hybrid stick mask according to a fourth embodiment of the present invention.
Figure 18:
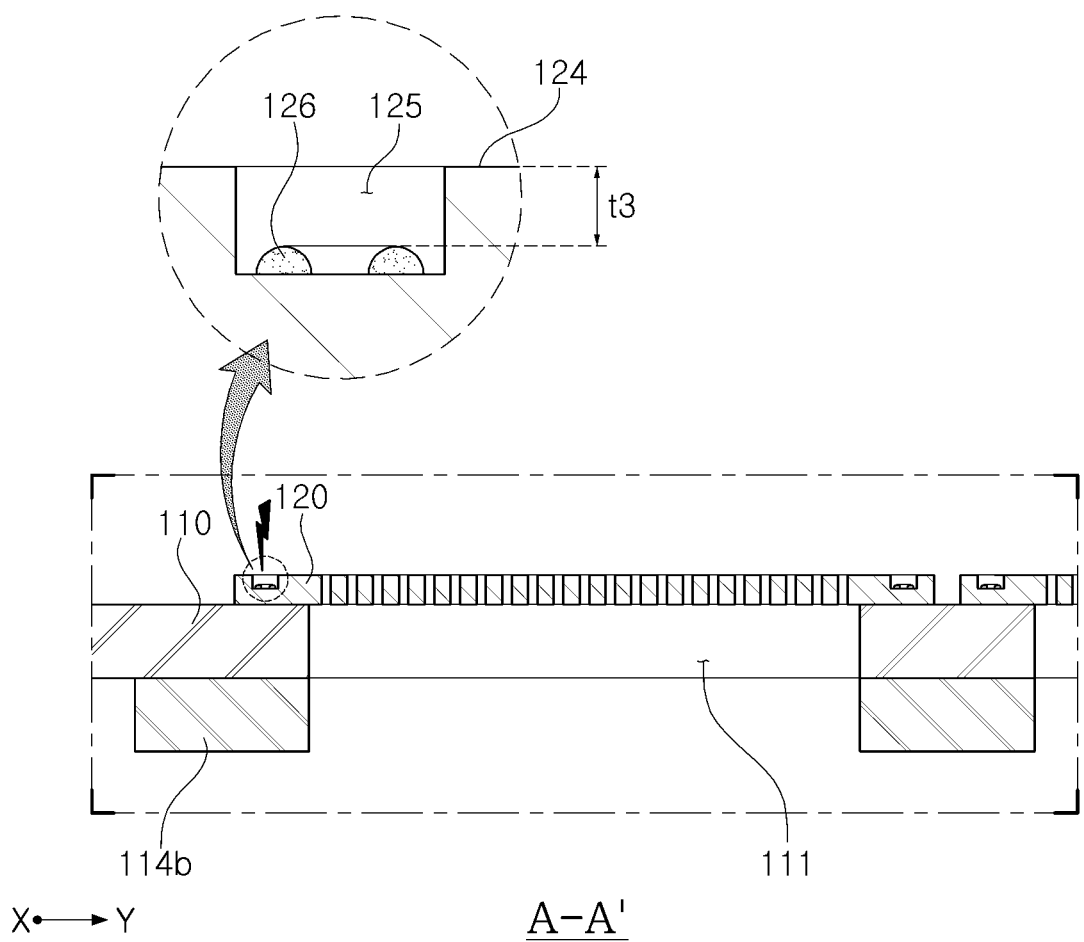
FIG. 18 is an enlarged cross-sectional view of part A-A' and illustrates the hybrid stick mask bonded by a laser beam emitted from a bottom surface according to the fourth embodiment of the present invention.
Figure 19:
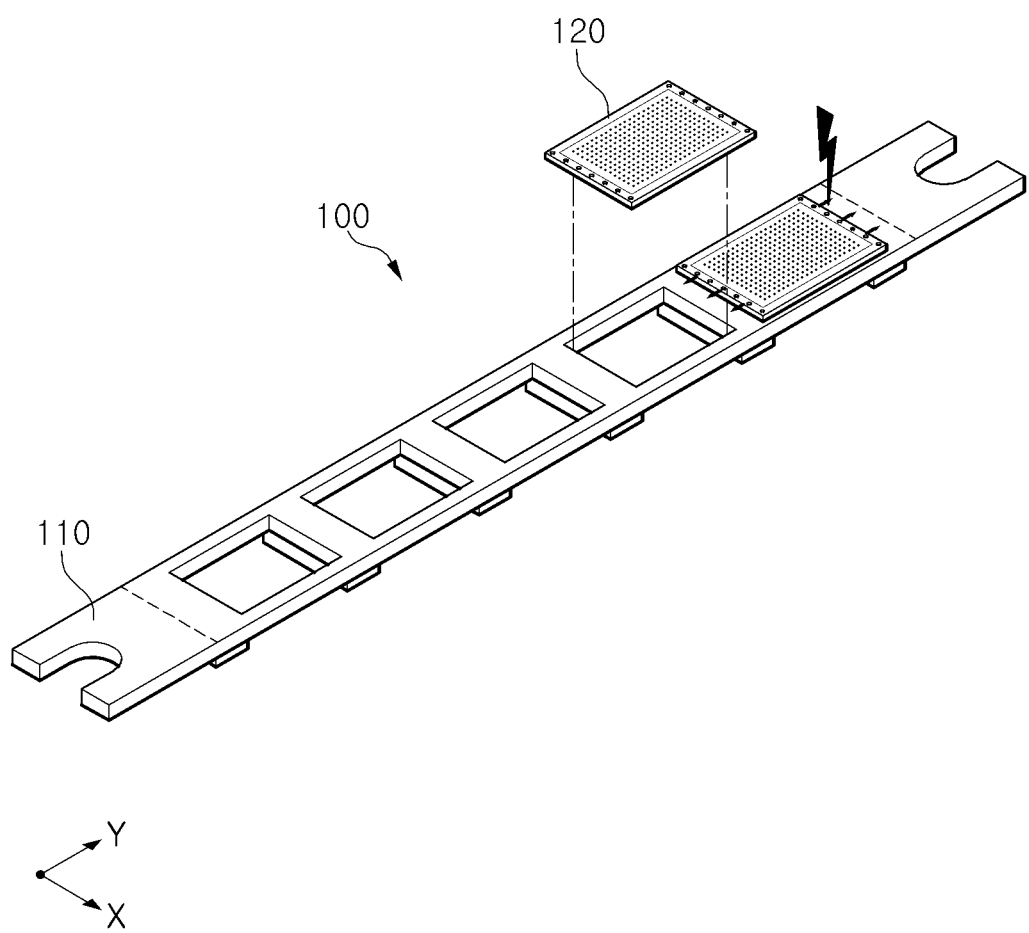
FIG. 19 is a manufacturing process view illustrating a cell-unit mask tension-bonded to a structural stick mask according to the fourth embodiment of the present invention.
Figure 20:
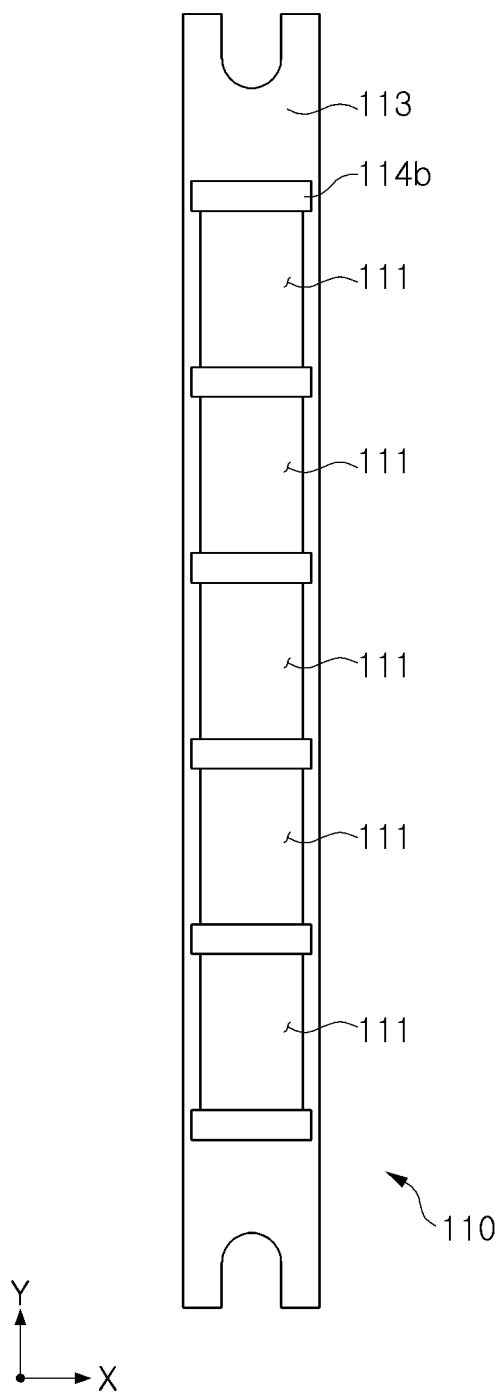
FIG. 20 is a bottom view illustrating the structural stick mask according to the fourth embodiment of the present invention.

FIG. 17 is a perspective view illustrating the hybrid stick mask according to the fourth embodiment of the present invention, FIG. 18 is an enlarged cross-sectional view of part A-A' and illustrates the hybrid stick mask bonded by a laser beam emitted from a bottom surface according to the fourth embodiment of the present invention, FIG. 19 is a manufacturing process view illustrating the cell-unit mask tension-bonded to the structural stick mask according to the fourth embodiment of the present invention, and FIG. 20 is a bottom view illustrating the structural stick mask according to the fourth embodiment of the present invention.

Structural Stick Mask 110

As shown in FIGS. 17 to 20, the reinforcing band 114b according to the fourth embodiment has a rectangular parallelepiped shape and may have a certain thickness and width corresponding to the rib of the structural stick mask 110. The structural stick mask 110 according to the fourth embodiment may include welding protrusions 126 formed on a rear surface of the bonding surface with the cell-unit mask 120 to be coupled to the reinforcing band 114b. In this case, the reinforcing band 114*b* and the structural stick mask 110 may be coupled by a laser beam provided below the reinforcing band 114*b*.

Cell-Unit Mask 120

As shown in FIGS. 17 to 20, the cell-unit mask 120 according to the fourth embodiment may include the welding groove 125.

The cell-unit mask 120 according to the fourth embodiment has a great thickness in comparison to the cell-unit mask 120 according to the first or third embodiment. That is, the cell-unit mask 120 according to the fourth embodiment may have a thickness greater than or equal to a certain thickness so as not to influence durability of the cell-unit mask 120 even when the welding groove 125 is formed.

The welding groove 125 may prevent a gap between the cell-unit mask 120 and the TFT glass which is caused by the welding protrusions 126 formed by welding when the cell-unit mask 120 and the structural stick mask 110 are coupled to each other. That is, the welding groove 125 may be provided to press the cell-unit mask 120 against the TFT glass without a gap in a deposition process even when weld-coupling is performed using a laser beam emitted from above. The welding groove 125 may be formed to have a step at a certain depth from the contact surface 124 with the TFT glass, which is one surface of the cell-unit mask 120.

Hereinafter, a method of manufacturing the hybrid stick mask 100 according to one embodiment of the present invention will be described with reference to FIGS. 2, 3, 7, 8, 12, 13, 18, and 19.

Figure 21:
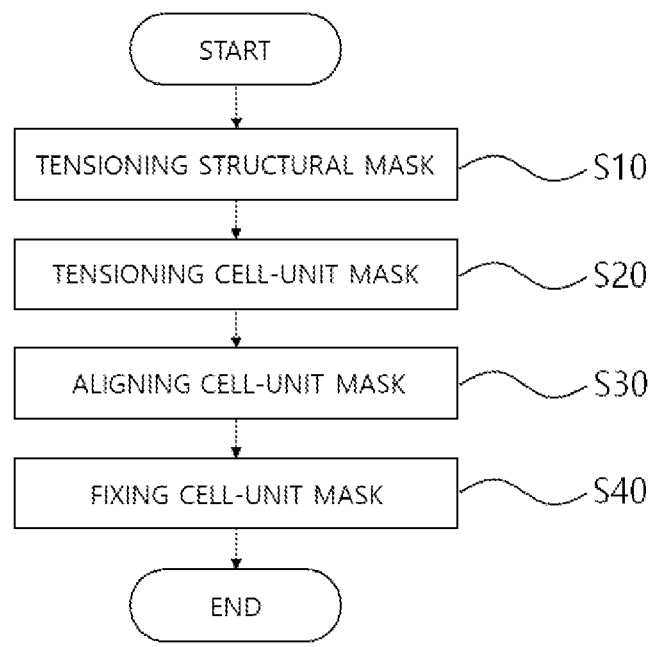
FIG. 21 is a flowchart illustrating a method of manufacturing a hybrid stick mask according to one embodiment of the present invention.

FIG. 21 is a flowchart illustrating a method of manufacturing a hybrid stick mask according to one embodiment of the present invention.

As shown in FIG. 21, the method of manufacturing the hybrid stick mask 100 may include tensioning a structural stick mask (s10), tensioning a cell-unit mask (s20), aligning the cell-unit mask (s30), and fixing the cell-unit mask (s40).

In the tensioning of the structural stick mask (s10), the structural stick mask 110 may be tensioned in a first direction using a clamp device (not shown). The respective tension-fixing portions 113 of the structural stick mask 110 are bitten by the clamp devices and pulled in mutually opposite directions to apply tension to the structural stick mask 110.

In the tensioning of the cell-unit mask (s20), the cell-unit mask 120 may be tensioned in the first direction or in the first direction and the second direction. In the tensioning of the cell-unit mask (s30), a cell-unit mask gripper (not shown) may apply tension to each cell-unit mask 120. That is, the cell-unit mask gripper may tension the cell-unit mask 120 in the first direction or in the first direction and the second direction while supporting one surface of the cell-unit mask 120 in a vertical direction.

In FIGS. 3, 8, 13, and 19, it is shown as an example that the cell-unit mask gripper tensions the cell-unit mask 120 in the first direction while supporting one surface of the cell-unit mask 120 in the vertical direction.

In the aligning of the cell-unit mask (s30), the cell-unit mask 120 may be moved to allow the deposition area 121 of the cell-unit mask 120 to correspond to the opening portion 111 of the structural stick mask 110 and the cell-unit mask 120 may be aligned at the TFT position of the TFT glass.

In more detail, in the aligning of the cell-unit mask (s30), the cell-unit mask gripper may move the cell-unit mask 120 to allow the deposition area 121 to correspond to the opening portion 111. That is, the cell-unit mask gripper may perform first position alignment by applying tension while supporting the cell-unit mask 120 to correspond to the opening portion 111.

In the aligning of the cell-unit mask (s30), second position alignment may be performed using a camera (not shown). The camera may be located below the hybrid stick mask 100. That is, it is possible to check, using the camera, whether a center of the position alignment hole 122 coincides with a center of the TFT position of the TFT glass within 1 μm. A position of the cell-unit mask gripper may be minutely adjusted in the first direction or the second direction to position-align the cell-unit mask 120 to the TFT position of the TFT glass.

In the fixing of the cell-unit mask (s40), the cell-unit mask 120 may be fixed to the structural stick mask 110. The cell-unit mask gripper may be moved in a Z– direction to seat and bond the second bonding area 123 on and to the first bonding area 112. In this case, boding may be performed through welding. While the cell-unit mask gripper presses the cell-unit mask 120 against the structural stick mask 110, the cell-unit mask 120 and the structural stick mask 110 may be bonded by the laser welder while forming the welding protrusions 115 or 126 on the first bonding area 112 and the second bonding area 123.

That is, the cell-unit mask 120 is position-aligned in the first direction or in the first direction and the second direction in the aligning of the cell-unit mask (s30) and position-aligned in the Z direction in the fixing of the cell-unit mask (s40) to position-align the cell-unit mask 120.

In the fixing of the cell-unit mask (s40) according to the first or third embodiment as shown in FIGS. 2 and 3 or 12 and 13, when the cell-unit mask 120 is coupled to the structural stick mask 110 by a laser beam emitted from below, the welding protrusions 115 may be protrusively formed on the bottom surface of the structural stick mask 110.

In the fixing of the cell-unit mask (s40) according to the second or fourth embodiment as shown in FIGS. 7 and 8 or 18 and 19, when the cell-unit mask 120 is coupled to the structural stick mask 110 by a laser beam emitted from above, the welding protrusions 126 may be protrusively formed on the basal surface of the welding groove 125. Here, the welding groove 125 may be formed to be stepped at a certain depth from the contact surface 124 with the TFT glass, which is one surface of the cell-unit mask 120.

Hereinafter, a mask assembly 10 including the hybrid stick mask 100 will be described.

Figure 22:
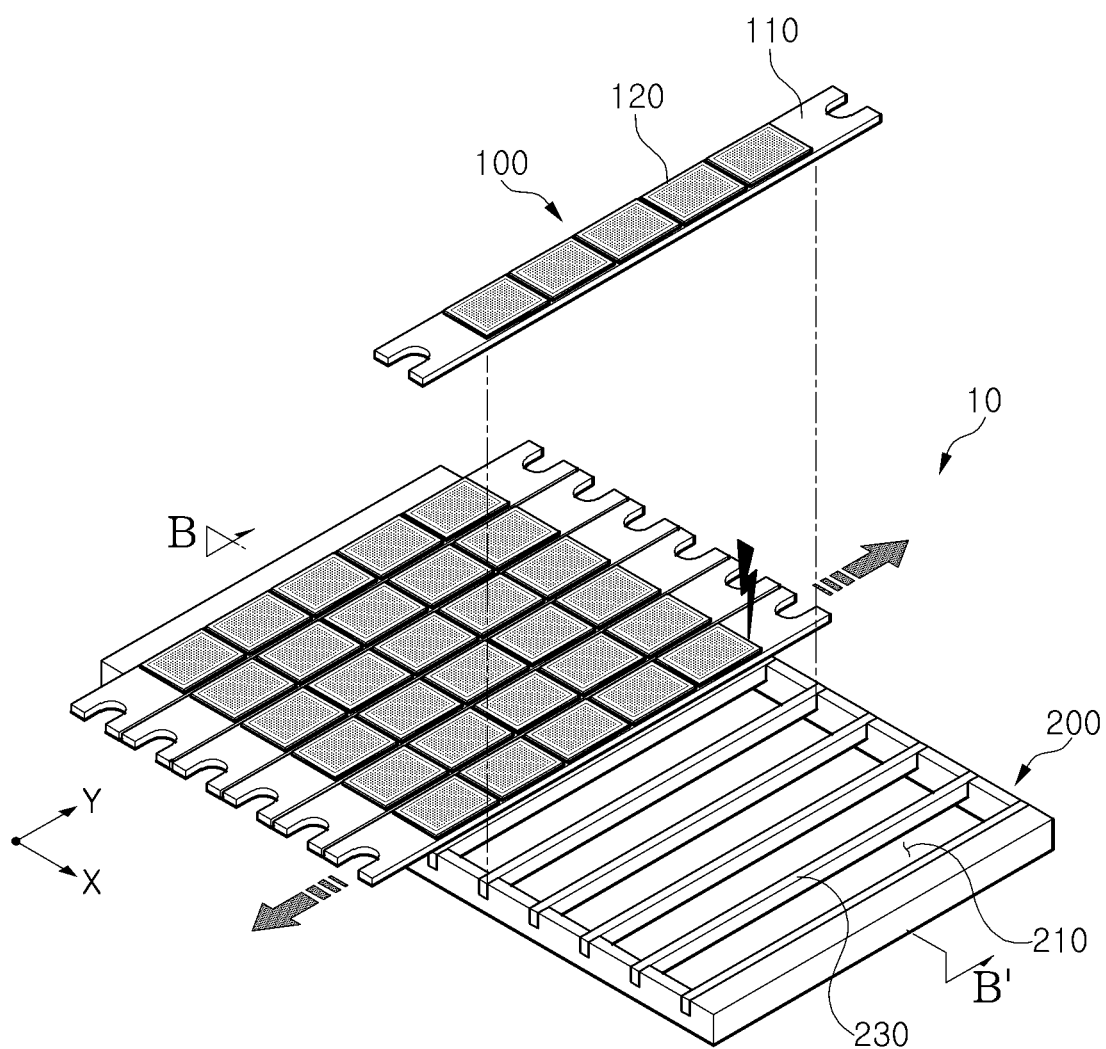
FIG. 22 is a perspective view illustrating a process of manufacturing a mask assembly according to the first embodiment of the present invention.
Figure 23:
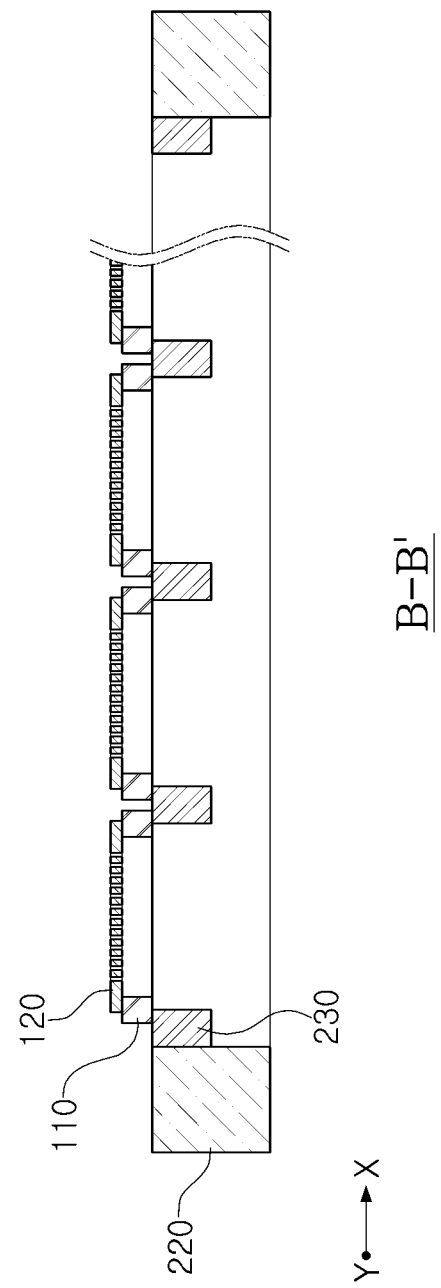
FIG. 23 is a front cross-sectional view illustrating part B-B' of FIG. 22.
Figure 24:
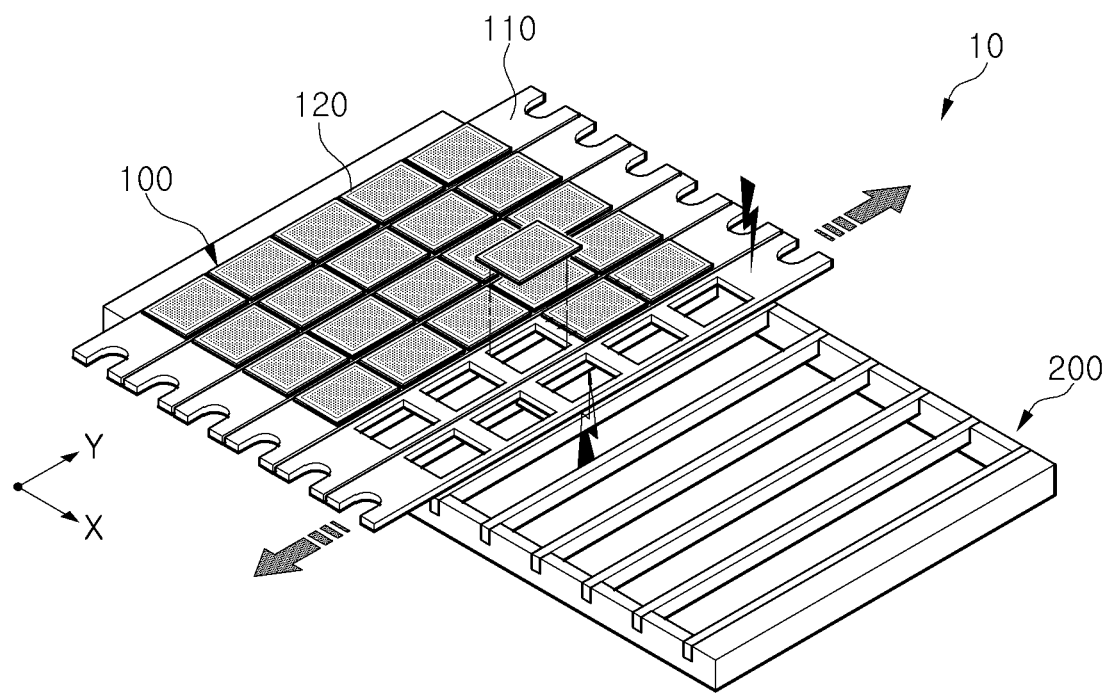
FIG. 24 is a perspective view illustrating a process of manufacturing a mask assembly according to the second embodiment of the present invention.
Figure 25:
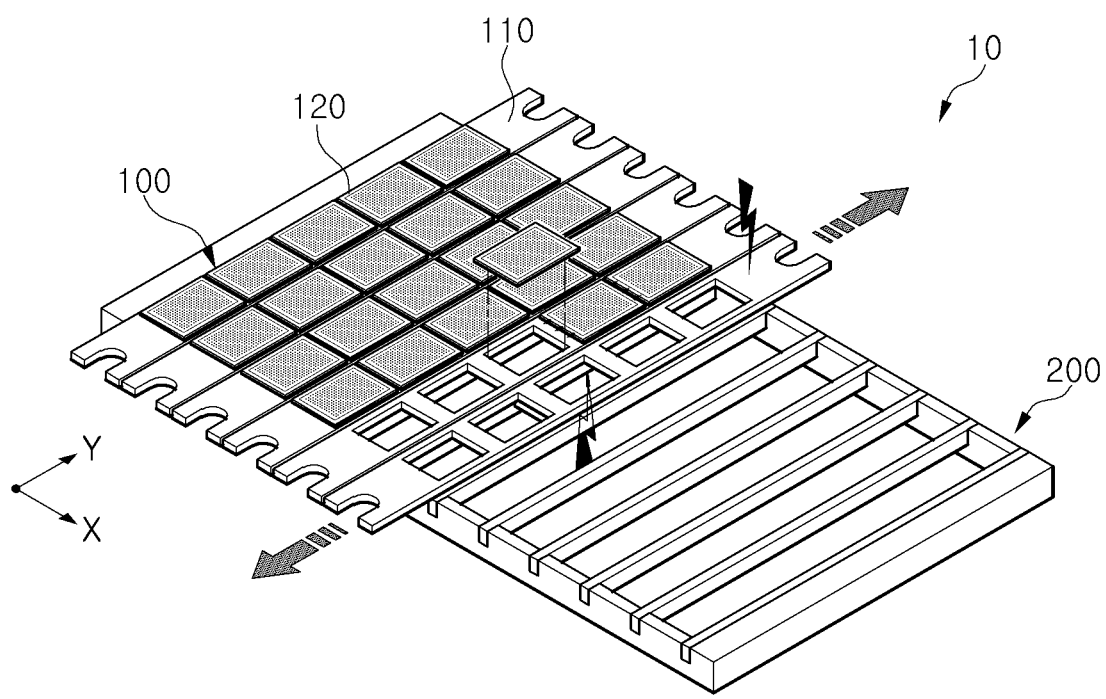
FIG. 25 is a perspective view illustrating a process of manufacturing a mask assembly according to the third embodiment of the present invention.
Figure 26:
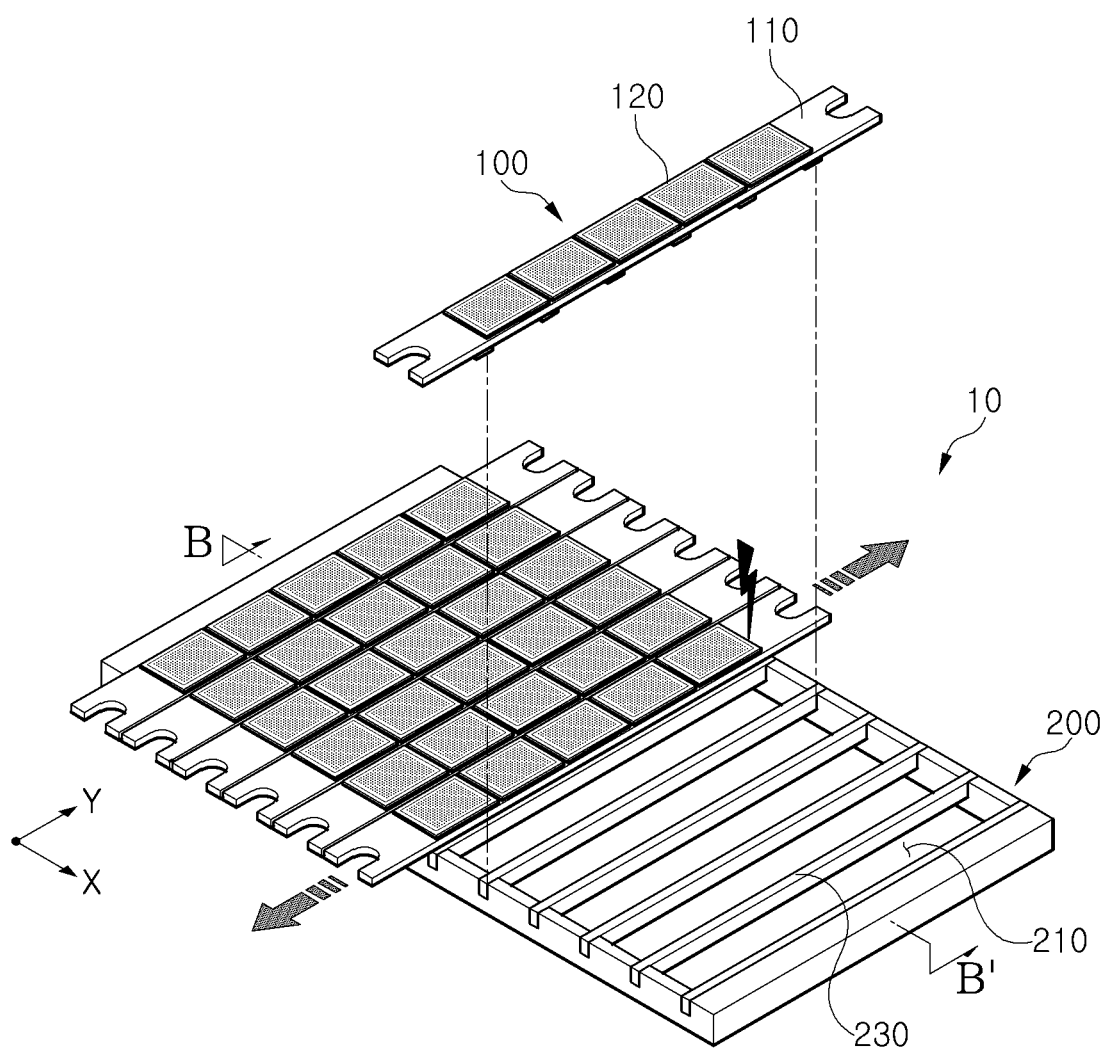
FIG. 26 is a perspective view illustrating a process of manufacturing a mask assembly according to the fourth embodiment of the present invention.
Figure 27:
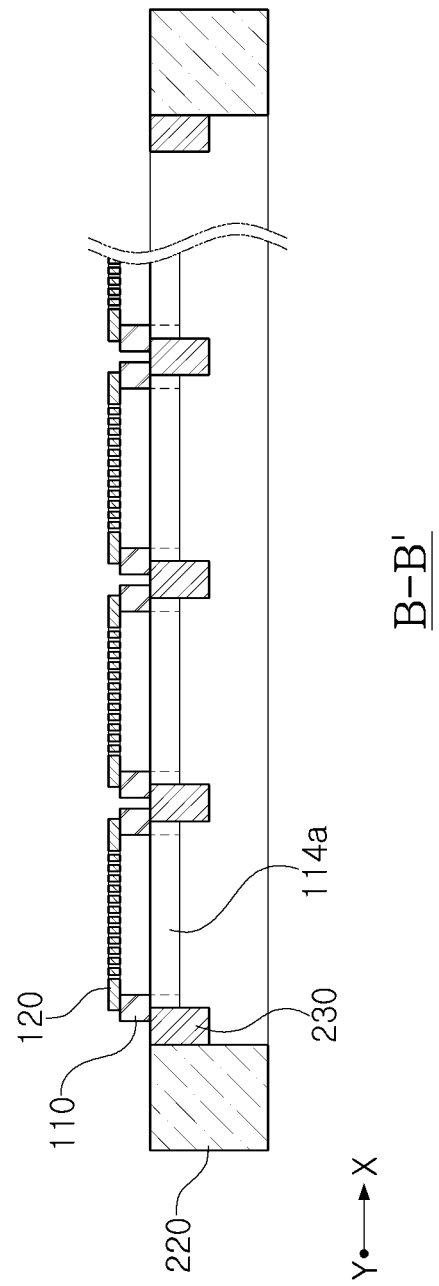
FIG. 27 is a front cross-sectional view illustrating part B-B' of FIG. 26.
Figure 28:
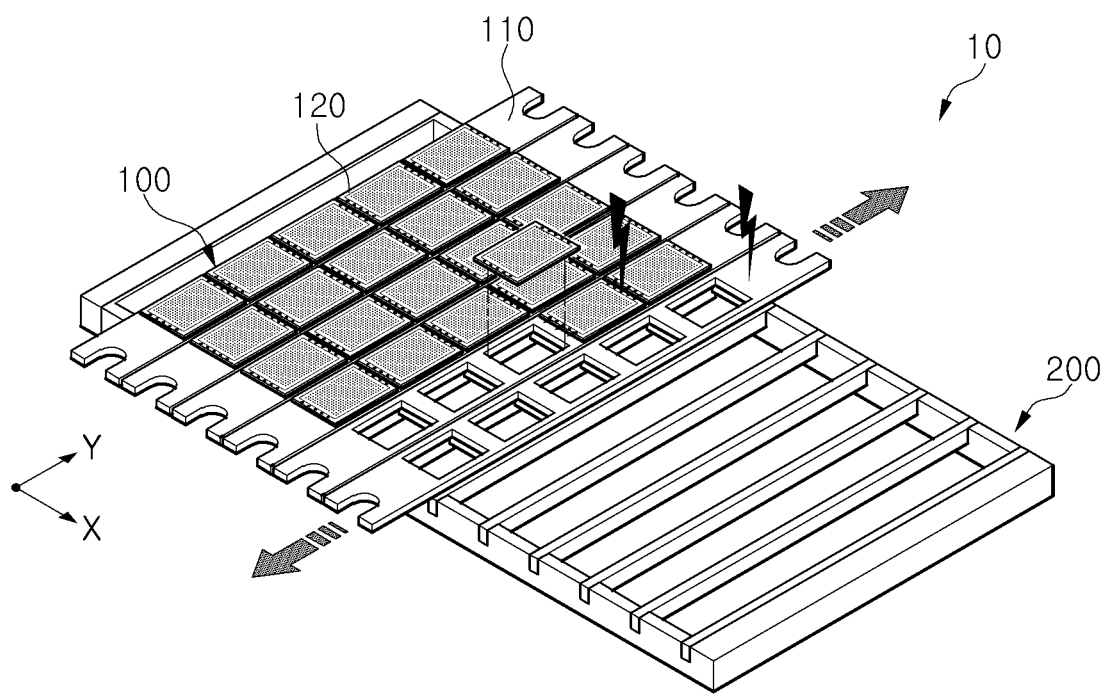
FIG. 28 is a perspective view illustrating a process of manufacturing a mask assembly according to a fifth embodiment of the present invention.
Figure 29:
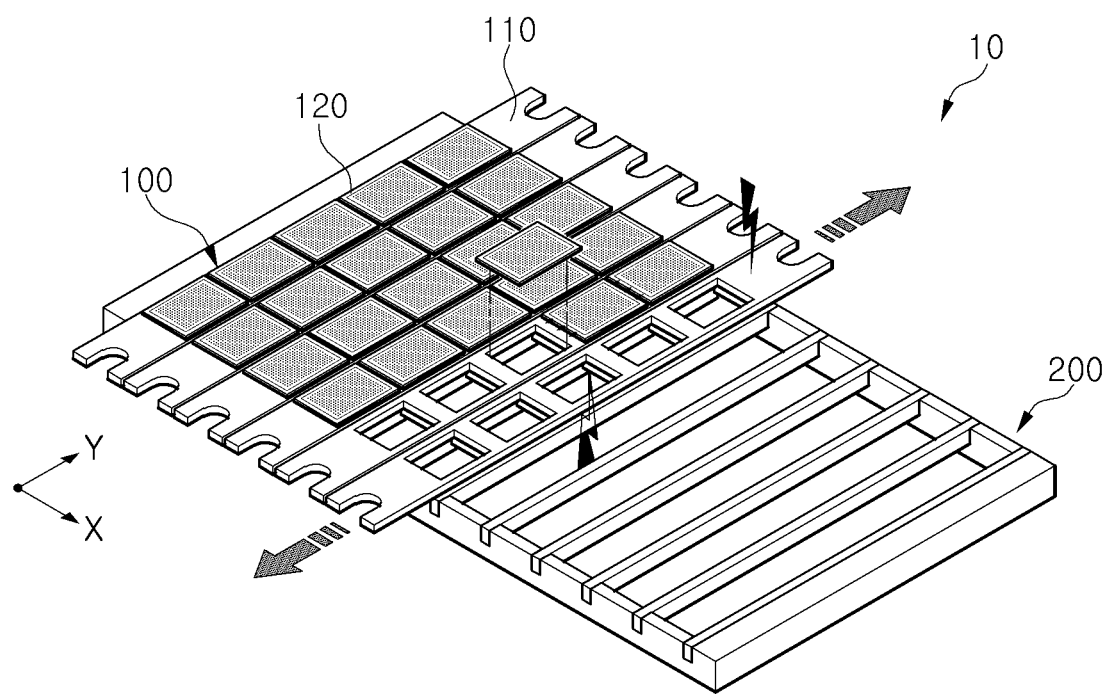
FIG. 29 is a perspective view illustrating a process of manufacturing a mask assembly according to a sixth embodiment of the present invention.
Figure 30:
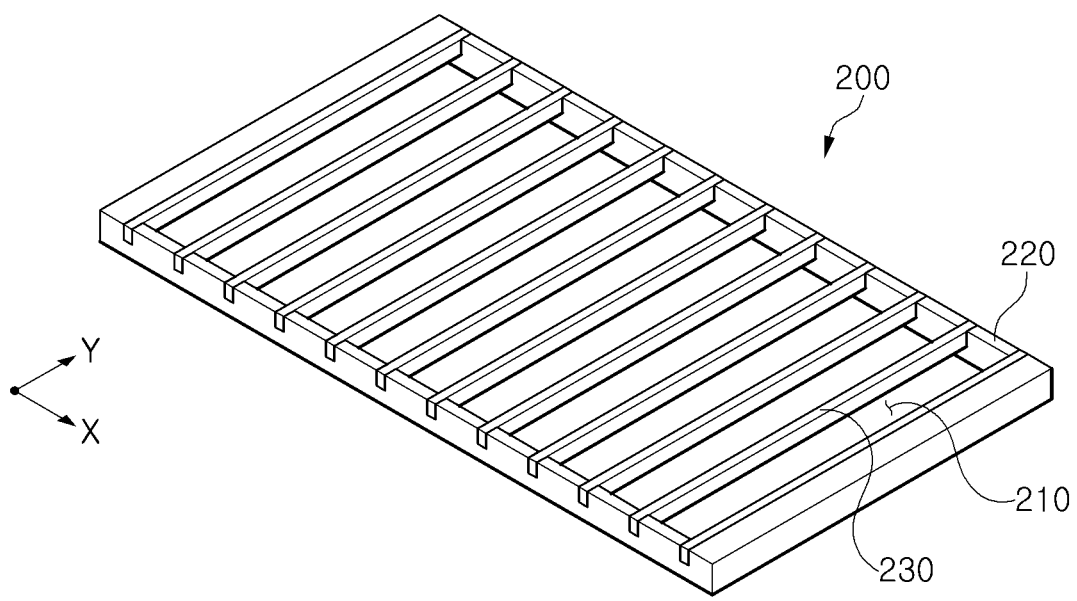
FIG. 30 is a perspective view illustrating a frame according to one embodiment of the present invention.

FIG. 22 is a perspective view illustrating a process of manufacturing a mask assembly according to the first embodiment of the present invention, FIG. 23 is a front cross-sectional view illustrating part B-B' of FIG. 22, FIG. 24 is a perspective view illustrating a process of manufacturing a mask assembly according to the second embodiment of the present invention, FIG. 25 is a perspective view illustrating a process of manufacturing a mask assembly according to the third embodiment of the present invention, FIG. 26 is a perspective view illustrating a process of manufacturing a mask assembly according to the fourth embodiment of the present invention, FIG. 27 is a front cross-sectional view illustrating part B-B' of FIG. 26, FIG. 28 is a perspective view illustrating a process of manufacturing a mask assembly according to a fifth embodiment of the present invention, FIG. 29 is a perspective view illustrating a process of manufacturing a mask assembly according to a sixth embodiment of the present invention, and FIG. 30 is a perspective view illustrating a frame according to one embodiment of the present invention.

Mask Assembly 10

Referring to FIGS. 22 to 29, the mask assembly 10 may provide a deposition pattern to allow a deposition material to be deposited at a particular location of the TFT glass during a deposition process. The mask assembly 10 may include a frame 200 and the hybrid stick mask 100.

Frame 200

Referring to FIGS. 22 to 30, the frame 200 according to one embodiment of the present invention may support the hybrid stick mask 100. The frame 200 may include an opening portion 210 in a center thereof. Also, the frame 200 may include a third bonding area 220. The frame 200 may include a metal material having high rigidity so that it is not deformed by compressive force acting in a tension direction of the hybrid stick mask 100. The frame 200 may have a certain thickness and a quadrangular shape.

Referring back to FIGS. 22 to 30, the opening portion 210 may expose the hybrid stick mask 100 in the Z direction. The opening portion 210 may have a vertically penetrating shape. The opening portion 210 may be formed to have a larger area than the deposition areas 121 in the first direction and the second direction so that it does not interfere with the respective deposition area 121 for the hybrid stick mask 100 in the Z direction. Accordingly, the opening portion 210 may be processed with low precision. The opening portion 210 may have a quadrangular shape for manufacturing and processing convenience.

Referring back to FIGS. 22 to 30, the third bonding area 220 may have a shape surrounding the opening portion 210, support one surface of the hybrid stick mask 100, and provide a bonding area with the hybrid stick mask 100. The bonding area of the hybrid stick mask may include both ends of the hybrid stick mask 100 in the first direction, that is, an area in surface contact with and bonded to the tension-fixing portion 113. In the third bonding area 220, a plurality of support grooves may be formed in the second direction intersecting with the bonding area of the hybrid stick mask. A pair of such support grooves may be formed in parallel in the first direction. The support grooves on both ends may accommodate a support portion 230.

Referring back to FIGS. 22 to 30, the support portion 230 may support the rib of the hybrid stick mask 100 and prevent the hybrid stick mask 100 from sagging. In addition, a gap between the mutually adjacent hybrid stick masks 100 may be blocked.

The support portion 230 may support an edge of the rib in parallel to the hybrid stick mask 100. The support portion 230 may be interposed between the frame 200 and the hybrid stick mask 100. The support portion 230 may be provided in the first direction. One end and the other end of the support portion 230 may be inserted into support grooves facing each other. A height of the support portion 230 may have the same thickness as the support groove. Accordingly, the support portion 230 may support the hybrid stick mask 100 at the same height as the third bonding area 220 in the Z direction.

The support portion 230 may have a trapezoidal shape having a width that gradually increases in the Z direction without interfering with a movement path of a material vaporized in a deposition process.

Hybrid Stick Mask 100

The content related to the hybrid stick mask 100 according to the first to fourth embodiments of the present invention described above with reference to FIGS. 1 to 20 can be referred to for omitted details.

In the hybrid stick mask 100, the tension-fixing portion 113 may be fixed to the third bonding area 220 while tension is applied in the first direction. The hybrid stick mask 100 may be fixed to the frame 200 by the tension-fixing portion 113 of the structural stick mask 110. The hybrid stick mask 100 may be welded to the frame 200 by a laser beam of the laser welder provided above it in the Z direction.

Hereinafter, a coupling structure between the frame 200 and the hybrid stick mask 100 in the mask assembly 10 will be described.

As shown in FIGS. 22, 23, 26, and 27, in the mask assembly 10 according to the first embodiment to the fourth embodiment of the present invention, the hybrid stick masks 100 may be aligned and fixed to the frame 200.

The cell-unit masks 120 may be tensioned and aligned on and fixed to the structural stick mask 110 to manufacture the hybrid stick mask 100.

The clamp device may apply tension to the tension-fixing portion 113 to align the hybrid stick masks 100 to dispose the deposition area 121 at the TFT position of the TFT glass. The aligned hybrid stick masks 100 may be moved in the Z direction to be seated in the third bonding area 220 of the frame 200. The hybrid stick mask 100 may be welded and coupled to the frame 200 by a laser beam of the laser welder provided above it in the Z direction.

As shown in FIGS. 24, 25, 28, and 29, the mask assembly 10 according to the second embodiment, the third embodiment, the fifth embodiment, and the sixth embodiment of the present invention may align and fix the structural stick masks 110 on and to the frame 200 and then align and fix the cell-unit masks 120 on and to the structural stick masks 110. FIGS. 24 and 28 or 25 and 29 show a difference in welding directions when the cell-unit masks 120 are coupled to the structural stick masks 110. The mask assembly 10 according to the second embodiment and the fifth embodiment of the present invention shown in FIGS. 24 and 28 corresponds to a case in which the cell-unit masks 120 are welded to top surfaces of the structural stick masks 110. The mask assembly 10 according to the third embodiment and the sixth embodiment of the present invention shown in FIGS. 25 and 29 corresponds to a case in which the cell-unit masks 120 are welded to bottom surfaces of the structural stick masks 110.

A method of manufacturing the mask assembly 10 according to the second embodiment and the fifth embodiment of the present invention shown in FIGS. 24 and 28 will be described below.

The clamp device may apply tension to the tension-fixing portion 113 to align the structural stick mask 110 so that all the opening portions 111 of the structural stick mask 110 are within the opening portion 210 of the frame 200. The aligned structural stick masks 110 may be moved in the Z direction to be seated in the third bonding area 220 of the frame 200. The structural stick mask 110 may be welded and coupled to the frame 200 by a laser beam of the laser welder provided above it in the Z direction.

That is, the cell-unit mask gripper may apply tension in the first direction or in the first direction and the second direction while supporting one surface of the cell-unit mask 120 in a vertical direction so that the deposition area 121 is aligned and disposed on the opening portion 111 of the structural stick mask 110.

The first bonding area 112 of the structural stick mask 110 and the second bonding area 123 of the cell-unit mask 120 may be welded by a laser beam of the laser welder provided above it in the Z direction to couple the respective cell-unit masks 120 to the structural stick mask 110. In this case, the welding protrusions 126 may be formed inside the welding groove 125 of the contact surface 124 of the cell-unit mask 120 with the TFT glass.

A method of manufacturing the mask assembly 10 according to the third embodiment and the sixth embodiment of the present invention shown in FIGS. 25 and 29 will be described below.

The clamp device may apply tension to the tension-fixing portion 113 to align the structural stick mask 110 so that all the opening portions 111 of the structural stick mask 110 are within the opening portion 210 of the frame 200. The aligned structural stick masks 110 may be moved in the Z direction to be seated in the third bonding area 220 of the frame 200. The structural stick mask 110 may be welded and coupled to the frame 200 by a laser beam of the laser welder provided above it in the Z direction.

That is, the cell-unit mask gripper may apply tension in the first direction or in the first direction and the second direction while supporting one surface of the cell-unit mask 120 in a vertical direction so that the deposition area 121 is aligned and disposed on the opening portion 111 of the structural stick mask 110.

The first bonding area 112 of the structural stick mask 110 and the second bonding area 123 of the cell-unit mask 120 may be welded by a laser beam of the laser welder provided below it in the Z direction to couple the respective cell-unit masks 120 to the structural stick mask 110. In this case, the welding protrusions 115 may be formed on the rear surface of the structural stick mask 110 corresponding to the bonding surface of the cell-unit mask.

An OLED display 1 according to another embodiment of the present invention which is manufactured using the above-described hybrid stick mask 100 will be described below.

Figure 31:
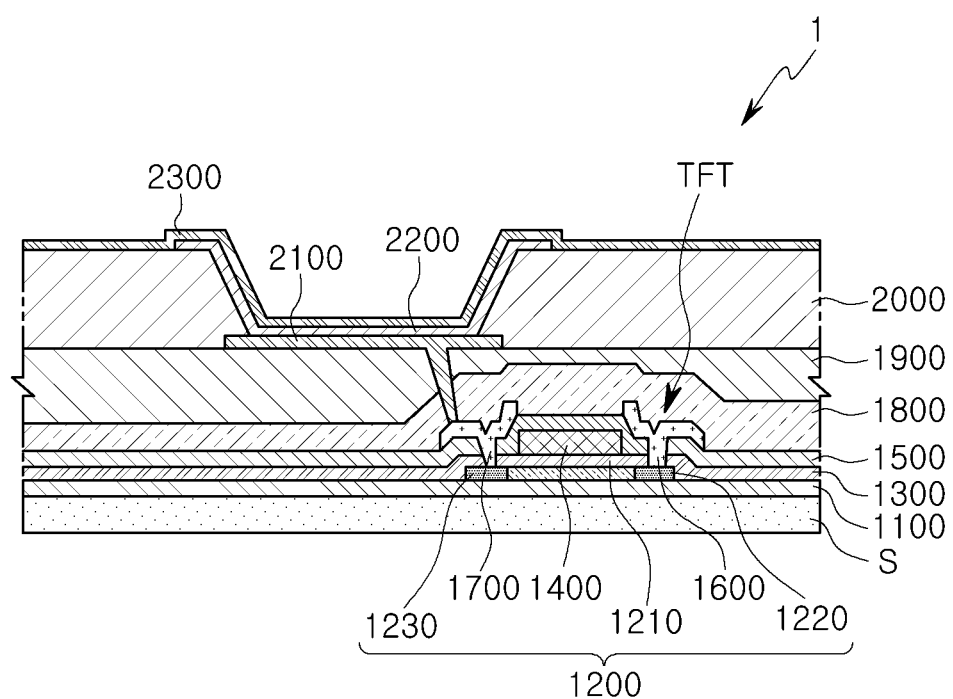
FIG. 31 is a cross-sectional view schematically illustrating an organic light emitting diode (OLED) display manufactured using the hybrid stick mask of FIGS. 1 to 20.

FIG. 31 is a cross-sectional view schematically illustrating the OLED display 1 manufactured using the hybrid stick mask of FIGS. 1 to 20.

Referring to FIG. 31, a variety of elements of the OLED display 1 may be formed on a substrate S. In this case, the substrate S may be a substrate itself or a part cut out from a substrate.

Common layers such as a buffer layer 1100, a gate insulation film 1300, an interlayer insulation film 1500, and the like may be formed on an entire surface of the substrate S. In addition, a patterned semiconductor layer 1200 including a channel region 1210, a source contact region 1220, and a drain contact region 1230 may be formed. A gate electrode 1400, a source electrode 1600, and a drain electrode 1700 which become elements of a TFT with the patterned semiconductor layer 1200 may be formed.

Also, a protective film 1800 configured to cover the TFT and a planarized film 1900 located on the protective film 1800 and having an approximately flat top surface may be formed on the entire surface of the substrate S. An OLED including a patterned pixel electrode 2100, a counter electrode 2300 approximately corresponding to the entire surface of the substrate S, and an intermediate layer 2200 interposed between the pixel electrode 2100 and the counter electrode 2300 and having a multilayer structure including an emission layer may be formed on the planarized film 1900 to be located thereon. However, unlike the drawings, one part of the intermediate layer 2200 may be a common layer approximately corresponding to the entire surface of the substrate S and another part thereof may be a pattern layer patterned to correspond to the pixel electrode 2100. The pixel electrode 2100 may be electrically connected to the TFT through a via hole. However, a pixel definition film 2000 including an opening configured to cover an edge of the pixel electrode 2100 and define each pixel area may be formed on the planarized film 1900 to approximately correspond to the entire surface of the substrate S.

In the case of the OLED display 1, at least some elements thereof may be formed using the hybrid stick mask or the method of manufacturing the hybrid stick mask according to the above-described embodiments.

The intermediate layer 2200 may be formed using the hybrid stick mask or the mask assembly according to the above-descried embodiments. For example, a hole injection layer (HIL), a hole transport layer (HTL), an emission layer (EML), an electron transport layer (ETL), an electron injection layer (EIL), and the like which may be included in the intermediate layer 2200 may be formed using the hybrid stick mask or the method of manufacturing the hybrid stick mask according to the above-described embodiments.

Although exemplary embodiments of the present invention have been described above in detail, the scope of the present invention is not limited to a particular embodiment and should be defined by the following claims. Also, it should be understood by one of ordinary skill in the art that a variety of modifications and changes may be made without departing from the scope of the present invention.

The invention claimed is:

1. A hybrid stick mask comprising:
a structural stick mask including a plurality of opening portions formed in a first direction, a first bonding area provided along a periphery of each of the plurality of opening portions, and tension-fixing portions provided on both ends of the structural stick mask in the first direction to be fixed to a frame of a mask assembly while tension is applied; and
a cell-unit mask comprising a deposition area corresponding to each of the plurality of opening portions and a second bonding area provided along a periphery of the deposition area of the cell-unit mask and bonded to the first bonding area,
wherein the hybrid stick mask comprises a plurality of cell-unit masks, wherein the plurality of cell-unit masks is separately coupled to the structural stick mask so that each of the plurality of cell-unit masks is placed on top of the structural stick mask, and the structural stick mask is configured to be tightly pulled when fixed to the frame.

2. The hybrid stick mask of claim 1, wherein the structural stick mask further comprises a reinforcing band provided on a rear surface thereof corresponding to a bonding surface of the structural stick mask with each of the plurality of cell-unit masks to correct position distortion of the deposition area on the basis of a thin film transistor (TFT) position of TFT glass.

3. The hybrid stick mask of claim 2, wherein the reinforcing band comprising a plurality of reinforcing bands,
wherein the plurality of such reinforcing bands are arranged in parallel and spaced apart from each other in the first direction.

4. The hybrid stick mask of claim 3, wherein each of the plurality of reinforcing bands comprises a vertical reinforcing wall surrounding a welding point between each of the plurality of cell-unit masks and the structural stick mask.

5. The hybrid stick mask of claim 1, wherein the structural stick mask comprises a welding protrusion protrusively formed on a rear surface thereof corresponding to a bonding surface of the structural stick mask with each of the plurality of cell-unit masks.

6. The hybrid stick mask of claim 1, wherein each of the plurality of cell-unit masks comprises a welding groove formed to be stepped from a contact surface with TFT glass with a certain depth.

7. The hybrid stick mask of claim 6, wherein a welding protrusion protrudes from a basal surface of the welding groove, and wherein a top end of the welding protrusion is formed to be lower than the contact surface.

8. The hybrid stick mask of claim 1, wherein each of the plurality of cell-unit masks has a thermal expansion coefficient different from the structural stick mask.

9. The hybrid stick mask of claim 1, wherein each of the plurality of cell-unit masks has a thickness different from the structural stick mask.

10. The hybrid stick mask of claim 1, wherein the deposition area comprises a position alignment hole which allows a deposition material to pass therethrough, and wherein the position alignment hole position-aligns each of the plurality of cell-unit masks on the basis of a TFT position of TFT glass and determines a welding position of each of the plurality of cell-unit masks.

11. The hybrid stick mask of claim 1, wherein the deposition area is hole-processed by any one of wet etching, electroplating, and laser machining.

12. A hybrid stick mask comprising a structural stick mask comprising a plurality of opening portions formed to correspond to deposition areas of respective cell-unit masks in a first direction and tension-fixing portions provided on both ends of the structural stick mask in the first direction to be fixed to a frame of a mask assembly while tension is applied, wherein the respective cell-unit masks are separately coupled to the structural stick mask so that each of the cell-unit masks is placed on top of the structural stick mask, and the structural stick mask is configured to be tightly pulled when fixed to the frame.

13. The hybrid stick mask of claim 12, wherein the structural stick mask further comprises a reinforcing band provided on a rear surface of a bonding surface with each of the cell-unit masks to correct position distortion of each of the deposition areas on the basis of a TFT position in the first direction.

* * * * *